(12) United States Patent
Klee et al.

(10) Patent No.: US 6,936,877 B2
(45) Date of Patent: Aug. 30, 2005

(54) INTEGRATED CIRCUIT INCLUDING A CAPACITOR WITH A HIGH CAPACITANCE DENSITY

(75) Inventors: Mareike Katharine Klee, Hueckelhoven (DE); Rainer Kiewitt, Roetgen (DE); Mike Ju, San José, CA (US); Wilfried Germer, Hamburg (DE); Hans-Wolfgang Brand, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 67 days.

(21) Appl. No.: 10/101,328

(22) Filed: Mar. 19, 2002

(65) Prior Publication Data

US 2002/0177326 A1 Nov. 28, 2002

Related U.S. Application Data

(60) Provisional application No. 60/277,736, filed on Mar. 21, 2001.

(51) Int. Cl.[7] .............................................. H01L 27/108
(52) U.S. Cl. ............................. 257/296; 257/295; 438/3
(58) Field of Search ................................. 257/7–9, 146, 257/295–296, 154, 528, 277, 536, 355, 288; 438/210, 3, 190, 238–239

(56) References Cited

U.S. PATENT DOCUMENTS

| | | | | |
|---|---|---|---|---|
| 4,344,223 A | | 8/1982 | Bulger et al. ................... 29/577 |
| 5,608,246 A | | 3/1997 | Yeager et al. ................. 257/295 |
| 5,789,303 A | * | 8/1998 | Leung et al. ................. 438/381 |
| 5,811,847 A | * | 9/1998 | Joshi et al. ................... 257/296 |
| 5,888,585 A | * | 3/1999 | Cuchiaro et al. .......... 427/126.3 |
| 5,920,775 A | * | 7/1999 | Koh ............................. 438/241 |
| 6,072,205 A | * | 6/2000 | Yamaguchi et al. ......... 257/277 |
| 6,091,655 A | * | 7/2000 | Yamada et al. .............. 365/210 |
| 6,204,069 B1 | * | 3/2001 | Summerfelt et al. ............ 438/3 |
| 6,211,005 B1 | * | 4/2001 | Kang .......................... 438/238 |
| 6,278,158 B1 | * | 8/2001 | Pastor et al. ................. 257/347 |
| 6,284,586 B1 | * | 9/2001 | Seliskar et al. .............. 438/239 |
| 6,285,050 B1 | | 9/2001 | Emma et al. ................ 257/296 |
| 6,294,805 B1 | * | 9/2001 | Jung ........................... 257/295 |
| 6,319,542 B1 | * | 11/2001 | Summerfelt et al. ........... 427/79 |
| 6,335,238 B1 | * | 1/2002 | Hanttangady et al. ....... 438/240 |
| 6,337,496 B2 | * | 1/2002 | Jung ........................... 257/295 |
| 6,358,794 B1 | * | 3/2002 | Oh .............................. 438/253 |
| 6,376,325 B1 | * | 4/2002 | Koo ............................ 438/396 |
| 6,433,993 B1 | * | 8/2002 | Hunt et al. .................. 361/303 |
| 6,495,874 B1 | * | 12/2002 | Kawamura et al. .......... 257/301 |
| 6,515,323 B1 | * | 2/2003 | Jung et al. ................... 257/295 |
| 6,603,161 B2 | * | 8/2003 | Kanaya et al. .............. 257/295 |
| 2001/0001488 A1 | * | 5/2001 | Eastep et al. ................ 257/295 |
| 2002/0103087 A1 | * | 8/2002 | Stauf et al. .................. 505/100 |
| 2002/0158278 A1 | * | 10/2002 | Ozawa et al. ................ 257/295 |
| 2003/0006439 A1 | * | 1/2003 | Bailey ......................... 257/295 |

FOREIGN PATENT DOCUMENTS

| | | | |
|---|---|---|---|
| DE | 19830569 C | 11/1999 | ......... H01L/27/105 |
| DE | 19851866 C | 3/2000 | ........... G11C/11/22 |
| EP | 1022768 A2 | 1/2000 | ........... H04L/21/02 |

* cited by examiner

*Primary Examiner*—Long Pham
*Assistant Examiner*—Thao X. Le
(74) *Attorney, Agent, or Firm*—Aaron Waxler

(57) ABSTRACT

The invention relates to an electronic device provided with an electronic component which comprises an integrated circuit arrangement which has a semiconducting substrate, active components, and passive components such as capacitors with high and with low capacitance values and/or resistors. The invention further relates to a transmitter, a receiver, an electronic component, a peripheral circuit, a power supply circuit, a filter module, and an integrated circuit arrangement.

17 Claims, 7 Drawing Sheets

INTEGRATED CIRCUIT INCLUDING A CAPACITOR WITH A HIGH CAPACITANCE DENSITY

This claims the benefit of Provisional Application Ser. No. 60/277,736 filed on Mar. 21, 2001.

FIELD OF THE INVENTION

The invention relates to an electronic device provided with an electronic component comprising an integrated circuit arrangement which comprises a semiconducting substrate having at least one active component and at least one capacitor provided on the semiconducting substrate and electrically connected to the active component. The invention further relates to a transmitter, a receiver, a peripheral circuit, a power supply circuit, a filter module, an electronic component, and an integrated circuit arrangement.

Capacitor networks or capacitor-resistor networks are used nowadays in numerous devices for electronic data processing or for mobile communication. These networks are often manufactured on ceramic substrates in thick-film technology, It is a disadvantage in this technology that only low capacitance values can be realized for the capacitors. A further disadvantage is that the capacitance values of the capacitors and the resistance values of the resistors can be provided with a wide tolerance range only. In addition, no active components such as, for example, diodes, can be integrated into these networks.

Capacitor networks or capacitor-resistor networks may also be provided on silicon substrates, which comprise integrated active components, in thin-film technology. A hybrid circuit is known, for example, from U.S. Pat. No. 4,344,223 which comprises a semiconducting substrate with an active component and, provided on an insulating layer present on the semiconducting substrate, a capacitor and a resistor. The dielectric of the capacitor in this circuit comprises $Ta_2O_5$ which is prepared through electrolytic oxidation of tantalum.

It is a disadvantage that only low capacitance densities of 500 $pF/mm^2$ up to 1.5 $nF/mm^2$ can be achieved with $Ta_2O_5$. If high capacitance values are to be achieved, large capacitor networks with a plurality of capacitors connected in parallel are to be manufactured.

SUMMARY OF THE INVENTION

It is accordingly an object of the present invention to counteract the disadvantages of the prior art and to provide an electronic device which comprises an electronic component fitted with an improved integrated circuit arrangement which comprises a semiconducting substrate with at least one active component and at least one capacitor.

This object is achieved by means of an electronic device provided with an electronic component comprising an integrated circuit arrangement which comprises a semiconducting substrate having at least one active component and at least one capacitor provided on the semiconducting substrate and electrically connected to the active component, wherein the capacitor has as its dielectric a dielectric compound with a dielectric constant $\epsilon_r > 20$.

The use of a dielectric compound with a dielectric constant $\epsilon_r > 20$ in the dielectric of the capacitor renders it possible to realize capacitance densities of 2 to 100 $nF/mm^2$. This has the advantage that the application range of the electronic device comprising the electronic component with the integrated circuit arrangement can be widened. In addition, the relevant devices can be miniaturized because the number of capacitors required can be reduced. Since also the external dimensions of the capacitor can be reduced owing to the higher capacitance density, valuable semiconductor material can be saved and the process cost can be lowered.

The use of the dielectric compounds as claimed in claim 2 in the dielectric of the capacitor renders it possible to realize high capacitance densities, because these dielectric compounds all have a dielectric constant $\epsilon_r > 20$.

The advantageous embodiment of the thin-film capacitor as defined in claim 3 renders it possible for its dielectric to have a smaller layer thickness d (d<1 $\mu$m) and thus a higher capacitance density.

The alternative arrangements of the capacitor placement as defined in claim 4 render it possible to realize electronic components with widely differing circuit arrangements for widely differing applications, in dependence on the requirements imposed on the electronic device.

The application range of the electronic component, and thus of the electronic device, can be widened by the advantageous embodiment of the circuit arrangement as defined in claim 5.

The invention further relates to a transmitter, a receiver, a peripheral circuit, a power supply circuit, and a filter module, each comprising an electronic component with an integrated circuit arrangement, an electronic component comprising an integrated circuit arrangement, as well as an integrated circuit arrangement which comprises a semiconducting substrate with at least one active component, and on the semiconducting substrate at least one capacitor which is electrically connected to the active component, while the capacitor has as its dielectric a dielectric compound with a dielectric constant $\epsilon_r > 20$.

Capacitors having high capacitance values are necessary in particular for electronic components and circuits which operate in the low-frequency range, such as, for example, peripheral circuits. Capacitance densities of 2 to 100 $nF/mm^2$ can be realized with the use of a dielectric compound having a dielectric constant $\epsilon_r > 20$ in the dielectric of the capacitor. In addition, the relevant electronic component or the corresponding circuit can be miniaturized, because the number of capacitors required can be reduced. Since also the external dimensions of the capacitor can be reduced owing to the higher capacitance density, valuable semiconductor material can be saved and the process cost can be lowered.

BRIEF DESCRIPTION OF THE DRAWINGS

The invention will now be explained in more detail below with reference to 15 Figures and 9 embodiments, in which.

DETAILED DESCRIPTION OF THE INVENTION

An electronic device may be, for example, a device for electronic data processing such as a computer, a laptop, or a PDA (Personal Digital Assistant). An electronic device may alternatively be a mobile data transmission device such as a mobile telephone.

A mobile telephone device comprises, for example, a power supply unit, a display device, a loudspeaker, a microphone, an input device, a storage device, an antenna, a transmitter, a receiver, peripheral circuits, a filter module, and current supply circuits. The transmitter, the receiver, the peripheral circuits, the filter module, and the current supply circuits may each comprise an electronic component with an integrated circuit arrangement which comprises a semiconducting substrate with at least one active component and on the semiconducting substrate at least one capacitor.

The active component may be, for example, a diode or a transistor. A diode serves as an overvoltage protection in the circuit arrangement. A diode may be, for example, a pn diode, a Zener diode, a back-to-back (reverse series) diode, a front-to-back (series) diode, or a floating diode.

The transistor may be, for example, a bipolar transistor or a field effect transistor (FET) such as, for example, a junction field effect transistor (JFET), P-channel Metal Oxide Semiconductor Field Effect Transistor (PMOS-FET), N-channel Metal Oxide Semiconductor Field Effect Transistor (NMOS-FET), or Complementary Metal Oxide Semiconductor Field Effect Transistor (CMOS-FET).

Capacitors having a dielectric compound with a dielectric constant $\epsilon_r > 20$ in their dielectric will be referred to as large capacitors hereinafter. Further capacitors, which have a dielectric compound with a dielectric constant $\epsilon_r < 20$ in their dielectric will be referred to as small capacitors.

Figure 1:
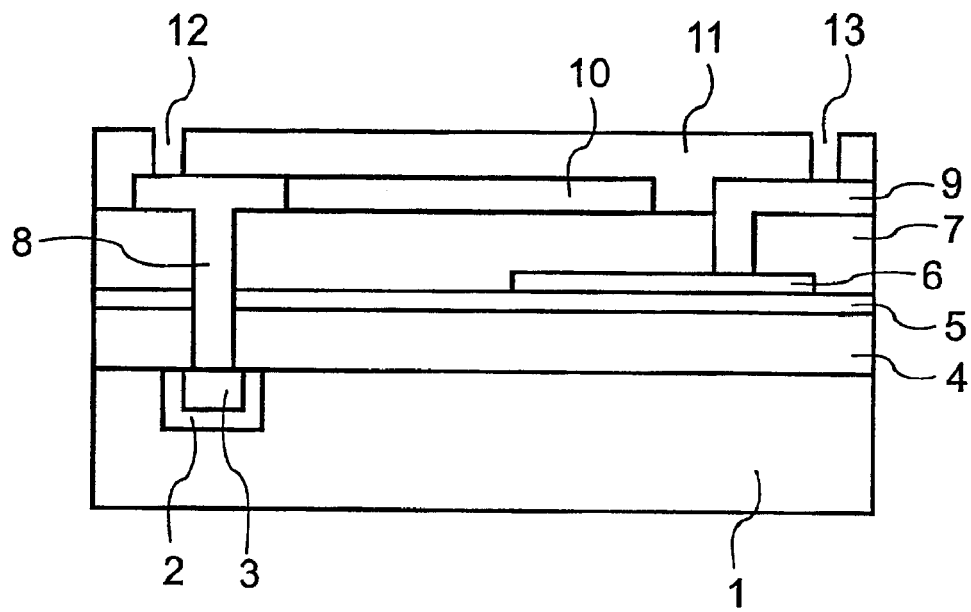
FIG. 1 is a diagrammatic cross-sectional view of a semiconducting substrate with a diode and a capacitor.

FIG. 1 shows a portion of a circuit arrangement with diodes and a capacitor network. FIG. 1 is a diagrammatic cross-sectional view of a semiconducting substrate 1 with a pn diode and a large capacitor. The semiconducting substrate 1 comprises, for example, Si with a dopant of a first doping type with a first doping density n1, or a III/V semiconductor such as, for example. GaAs with a dopant of a first doping type with a first doping density n1, or a SiC semiconductor with a dopant of a first doping type with a first doping density n1, or a SiGe semiconductor with a dopant of a first doping type with a first doping density n1. In the semiconducting substrate 1 there is a first semiconductor region 2 which comprises Si with a dopant of a first doping type with a second doping density n2, or a III/V semiconductor, for example GaAs, with a dopant of a first doping type with a second doping density n2, or a SiC semiconductor with a dopant of a first doping type with a second doping density n2. The doping density n2 in the first semiconductor region 2 is smaller than the doping density n1 in the semiconducting substrate 1. A second, smaller semiconductor region 3 is present in the first semiconductor region 2, which region 3 comprises Si with a dopant of a second doping type with a third doping density n3, or a III/V semiconductor, for example GaAs, with a dopant of a second doping type with a third doping density n3, or SiC with a dopant of a second doping type with a third doping density n3. The dopant of a first doping type may be, for example, B, Al, or Ga, and the dopant of a second doping type may be, for example, P, As, or Sb. The first semiconductor region 2 and the second semiconductor region 3 together form a pn diode.

An insulating layer 4, for example comprising $SiO_2$, $SiO_2$ doped with a doping oxide such as, for example, boron oxide or phosphorus oxide, or SiN(H) is provided on the semiconducting substrate 1. On the insulating layer 4 lies a barrier layer 5 which may be made, for example, of SiN(H), $SiO_2$, $TiO_2$, $Al_2O_3$, $HfO_2$, MgO, $ZrO_2$, or a combination of these materials. A first electrically conducting layer 6 is provided on the barrier layer 5 and structured such that it forms the first electrode of the large capacitor. The first electrically conducting layer 6 may comprise, for example, Pt, with a layer thickness of 50 nm to 1 μm, Ti with a layer thickness of 1 to 50 nm/Pt with a layer thickness of 20 to 600 nm, Ti with a layer thickness of 1 to 50 nm/Pt with a layer thickness of 20 to 600 nm/Ti with a layer thickness of 1 to 20 nm, $Ti_{1-x}W_x$/Pt ($0 \leq x \leq 1$), $Ti_{1-x}W_x$Ru ($0 \leq x \leq 1$), $Ti_{1-x}W_x$/Ir ($0 \leq x \leq 1$), Ta/Pt, $Ta_{1-x-y}Si_xN_y$/Ir ($0 \leq x \leq 1$, $0 \leq y \leq 1$), $Ta_{1-x-y}Si_xN_y$/Pt ($0 \leq x \leq 1$, $0 \leq y \leq 1$), $Ta_{1-x-y}Si_xN_y$Ru ($0 \leq x \leq 1$, $0 \leq y \leq 1$), $Ti_{1-x}N_x$Ir ($0 \leq x \leq 1$), $Ti_{1-x}N_x$/Pt ($0 \leq x \leq 1$), $Ti_{1-x}N_x$/Ru ($0 \leq x \leq 1$), $Ta_{1-x}N_x$Ir ($0 \leq x \leq 1$), $Ta_{1-x}N_x$/Pt ($0 \leq x \leq 1$), $Ta_{1-x}N_x$/Ru ($0 \leq x \leq 1$), $Ti_{1-x-y}Al_xN_y$/Pt ($0 \leq x \leq 1$, $0 \leq y \leq 1$), $Ti_{1-x-y}Al_xSi_y$Ru ($0 \leq x \leq 1$, $0 \leq y \leq 1$), $Ti_{1-x-y}Al_xSi_y$Ir ($0 \leq x \leq 1$, $0 \leq y \leq 1$), W, Ni, Mo, Au, Cu, Ti/Pt/Al, Ti/Ag, Ti/Ag/Ti, Ti/Ag/Ir, Ti/Ir, Ti/Pd, $Ti/Ag_{1-x}Pt_x$($0 \leq x \leq 1$), $Ti/Ag_{1-x}Pd_x$ ($0 \leq x \leq 1$), $Ag_{1-x}Pt_x$ ($0 \leq x \leq 1$), $Ti/Pt_{1-x}Al_x$ ($0 \leq x \leq 1$), $Pt_{1-x}Al_x$ ($0 \leq x \leq 1$), $Ti/Ag/Pt_{1-x}Al_x$ ($0 \leq x \leq 1$), Ti/Ag/Ru,Ru, $Ru/RuO_2$,Ti/Ru, Ti/Ir, $Ti/Ir/IrO_2$, $Ir/IrO_2$/Pt, $Ti/Ru/Ru_{1-x}Pt_{1-x}$ ($0 \leq x \leq 1$), $Ti/Ag/Ir/IrO_x$ ($0 \leq x \leq 2$), Ti/Ag/$Ru/Ru/O_x$ $Ti/Ir/IrO_2$, $Ir/IrO_2$Pt, $Ti/Ru/Ru_xPt_{1-x}$ ($0 \leq x \leq 1$), $Ti/Ag/Ir/IrO_x$ ($0 \leq x \leq 2$), $Ti/Ag/Ru/RuO_x$ ($0 \leq x \leq 2$), $Ti/Ag/Ru/Ru_xPt_{1-x}$ ($0 \leq x \leq 1$), $Ti/Ag/Ru/Ru_xPt_{1-x}RuO_y$ ($0 \leq x \leq 1$, $0 \leq y \leq 2$), $Ti/Ag/Ru/RuO_x/Ru_yPt_{1-y}$ ($0 \leq x \leq 2$, $0 \leq y \leq 1$), $Ti/Ag/Ru_xPt_{1-x}$ ($0 \leq x \leq 1$), $Ti/Ag/Pt_xAl_{1-x}$ ($0 \leq x \leq 1$), $Pt_xAl_{1-x}/Ag/Pt_yAl_{1-y}$ ($0 \leq x \leq 1$, $0 \leq y \leq 1$), $Ti/Ag/Pt_y(RhO_x)_{1-y}$ ($0 \leq x \leq 2$, $0 \leq y \leq 1$), $Ti/Ag/Rh/RhO_x$ ($0 \leq x \leq 2$), Rh, $Rh/RhO_2$, $Ti/Ag/Pt_xRh_{1-x}$ ($0 \leq x \leq 1$), $Ti/Ag/Pt_y(RhO_x)_{1-y}/Pt_zRh_{1-z}$ ($0 \times \leq 2$, $0 \leq y \leq 1$, $0 \leq z \leq 1$), $Ti/Ag_xPt_{1-x}$/Ir ($0 \leq x \leq 1$), $Ti/Ag_xPt_{1-x}Ir/IrO_y$ ($0 \leq x \leq 1$, $0 \leq y \leq 2$), $Ti/Ag_xPt_{1-x}Al_{1-y}$ ($0 \leq x \leq 1$, $0 \leq y \leq 1$), $Ti/Ag_xPt_{1-x}$/Ru ($0 \leq x \leq 1$), $Ti/Ag_xPt_{1-x}$/Ru/$RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, $Ti/Rh/RhO_2$, Ti/Ni/Al/ITO, Ti/Ni, Ti/W/Ti, $W_xTi_{1-x}$ ($0 \leq x \leq 1$), $W_xTi_{1-x}$/Al(Cu) ($0 \leq \times 23$ 1), $W_xTi_{1-x}$/Al(Si) ($0 \leq x \leq 1$), $W_xTi_{1-x}$/Al ($0 \leq x \leq 1$), Al, Al doped with Cu, Al doped with Si, $Ni_xCr_yAl_z$/Al ($0 \leq x \leq 1$, $0 \leq y \leq 1$, $0 \leq z \leq 1$), $Ni_xCr_yAl_z$/Al doped with Cu ($0 \leq x \leq 1$, $0 \leq y \leq 1$, $0 \leq z \leq 1$), $Ni_xCr_yAl_z$/Al doped with Si ($0 \leq x \leq 1$, $0 \leq y \leq 1$, $0 \leq z \leq 1$), β-Ta/Al or Ti/Cu. A first dielectric layer 7 is present on the first electrically conducting layer 6 and on those regions of the barrier layer 5 which are not covered by the first electrically conducting layer 6. The first dielectric layer 7 comprises a dielectric compound which has a dielectric constant $\epsilon_r \geq 20$. The material used in the first dielectric layer may be, for example, $PbZr_xTi_{1-x}O_3$ ($0 \leq x \leq 1$) with and without dopants of La and/or Mn and/or Nb and with and without excess lead, layer packages of $PbZr_xTi_{1-x}O_3$ ($0 \leq x \leq 1$) and $PbZr_xTi_{1-x}O_3$ ($0 \leq x \leq 1$) with dopants of La and/or Mn and/or Nb and with and without excess lead, layer packages of $PbZr_xTi_{1-x}O_3$ ($0 \leq x \leq 1$) with and without dopants and with and without excess lead and $[PbMg_{1/3}Nb_{2/3}O_3]_x$-$[PbTiO_3]_{1-x}$ ($0 \leq x \leq 1$) with and without dopants, $Ba_{1-x}Sr_x$-$TiO_3$ ($0 \leq x \leq 1$) with and without dopants, $Ba_{1-x}Sr_xTiO_3$ ($0 \leq x \leq 1$) with and without additions of $VO_x$ ($1 \leq x \leq 2.5$) and/or $SiO_2$, $[Ba_{1-x}Sr_xTiO_3]$-$Pb_{1-y}Ca_yTiO_3$ ($0 \leq x \leq 1$, $0 \leq y \leq 1$), $Ba_{1-x}Sr_xZr_yTi_{1-y}O_3$ ($0 \leq x \leq 1$, $0 \leq y \leq 1$) with and without dopants, $Ba_{1-x}Pb_xTiO_3$ ($0 \leq x \leq 1$) with and without excess lead, $Ba_{1-x}Ca_xTiO_3$ ($0 \leq x \leq 1$), $SrZr_xTi_{1-x}O_3$ ($0 \leq x \leq 1$) with and without dopants, $[PbMg_{1/3}Nb_{2/3}O_3]_3$-$[PbTiO_3]_{1-x}$ ($0 \leq x \leq 1$), with and without dopants and with and without excess lead $(Pb,Ba,Sr)(Mg_{1/3}Nb_{2/3}(_xTi_y(Zn_{1/3}Nb_{2/3}))_{1-x-y})O_3$ ($0 \leq x \leq 1$, $0 \leq y \leq 1$), $Pb_{1-x}Ca_xTiO_3$ ($0 \leq x \leq 1$), $(Ba_{1-x+y/8}Sr_{x+y/8}(_2Na_{1-y}Nb_5O_{15})$ ($0 \leq x \leq 1$, $0 \leq y \leq 1$) with and without excess $Na^+$, $(Ba_{1-x+y/8}Sr_{x+y/8})_2K_{1-y}Nb_5O_{15}$ ($0 \leq x \leq 1$, $0 \leq y \leq 1$) with and without excess $K^+$, $(Ba_{1-x}Sr_x)_2K_{1-3y}SE_yNb_5O_{15}$ ($0 \leq x \leq 1$, $0 \leq y \leq 1$, SE=Ion from the group of rare earth metals), $Sr_2Ba_4Ti_2Nb_8O_{30}$, $(Ta_2O_5)_x$-$(Al_2O_3)_{1-x}$ ($0 \leq x \leq 1$), $(Ta_2O_5)_x$-$(0 \leq x \leq 1)$, $(Ta_2O_x)_x$-$(Nb_2O_5)_{1-k}$ ($0 \leq x \leq 1$), $(Ta_{O5})_x$-$(SiO_2)_{1-x}$ ($0 \leq x \leq 1$), $(Ta_2O_5)_x$-$(ZrO_2)_{1-x}$ ($0 \leq x \leq 1$), $TiO_2$, $Nb_2O_5$ $Zr(Sn,Ti)O_4$, $BiNbO_4$ with and without $VO_x$ ($1 \leq x \leq 2.5$) and/or $CuO$ dopants, $(Bi_{2-x}Zn_x)(Nb_{2-y}Zn_y)O_x$, $Bi_2(Zn_{1/3}Nb_{2/3})_2O_2$, a) $PbMg_{1/2}W_{1/2}O_3$
b) $PbFe_{1/2}Nb_{1/2}O_3$
c) $PbFe_{2/3}W_{1/3}O_3$
d) $PbNi_{1/3}Nb_{2/3}O_3$
e) $PbZn_{1/3}Nb_{2/3}O_3$
f) $PbSc_{1/2}Ta_{1/2}O_3$ as well as combinations of the compounds a)–f) with $PbTiO_3$ and/or $PbMg_{1/3}Nb_{2/3}O_3$, $CaO_xZnO_y(Nb_2O_5)_z$ (x=0.01 to 0.05, y=0.43 to 0.55, z=0.44 to 0.52), $(BaTiO_3)_{0.18\ to\ 0.27}$+$(Nd_2O_3)_{0.316\ to\ 0.355}$+$(TiO_2)_{0.276\ to\ 0.355}$ ⇌ $(Bi_2O_3)_{0.025\ to\ 0.081}$+x ZnO, $CaTiO_3$+$CaTiSiO_5$, $(Sr,Ca)(Ti,Zr)O_3$, $(Sr,Ca,M)(Ti,Zr)O_3$ (M=Mg or Zn), $(sr,Ca,Mg,Zn)(Ti,Zr,Si)O_3$, $(Sr,Ca,Cu,Mn,Pb)TiO_3$+$Bi_2O_3$, $BaO$-$TiO_2$-$Nd_2O_3$-$Nb_2O_5$, $(Bi_2O_3)_x(Nb_2O_5)_{1-x}$ with additions of $SiO_2$, $MnO_2$ or $PbO$, $(Ba,Ca)TiO_3$+$Nb_2O_5$, $Co_2O_3$, $MnO_2$, $BaO$-$PbO$-$Nd_2O_3$-$TiO_2$, $Ba(Zn,Ta)O_3$, $BaZrO_3$, $Ba_2Ti_9O_{20}$, $Ba_2Ti_{9-x}Zr_xO_{20}$ ($0 \leq x \leq 1$) with and without Mn doping, $BaTi_5O_{11}$, $BaTi_4O_9$, $Ca_xSm_yTi_zO_n$ ($0 \leq x \leq 1$, $0.5 \leq y \leq 1$, $0 \leq z \leq 1$, $0 \leq n \leq 1$), $[Bi_3(Ni_2Nb)O_9]_{1-x}$-$(Bi_2(ZnNb_{2(1+d(y)}O_{3+6y+5yd})_x$ ($0 \leq x \leq 1$, $0.5 \leq y \leq 1.5$, $-0.05 \leq d \leq 0.5$), $CaZrO_3$, $Nd_2Ti_2O_7$ and $PbNb_{4/5x}((Zr_{0.6}Sn_{0.4})_{1-y}Ti_y)_{1-x}O_3$ ($0 \leq x \leq 0.9$, $0 \leq y \leq 1$). On the first dielectric layer 7 lies a second electrically conducting layer 10 which comprises, for example, β-Ta/Al, β-Ta/Al doped with Si, β-Ta/Al doped with Cu, $W_xTi_{1-x}$($0 \leq x \leq 1$), $W_xTi_{1-x}$/Al(Cu) ($0 \leq x \leq 1$), $W_xTi_{1-x}$/Al (Si) ($0 \leq x \leq 1$), $W_xTi_{1-x}$/Al ($0 \leq x \leq 1$), Al, Al doped with Cu, Al doped with Si, $Ni_xCr_yAl_z$/Al ($0 \leq x \leq 1$, $0 \leq y \leq 1$, $0 \leq z \leq 1$), $Ni_xCr_yAl_z$/Al doped with Cu ($0 \leq x \leq 1$, $0 \leq y \leq 1$, $0 \leq z \leq 1$), $Ni_xCr_yAl_z$/Al doped with Si ($0 \leq x \leq 1$, $0 \leq y \leq 1$, $0 \leq z \leq 1$), Ti/Cu, Pt with a layer thickness of 50 nm to 1 μm, Ti with a layer thickness of 1 to 50 nm/Pt with a layer thickness of 20 to 600 nm, Ti with a layer thickness of 1 to 50 nm/Pt with a layer thickness of 20 to 600 nm/Ti with a layer thickness of 1 to 20 nm, Ta/Pt, $Ti_{1-x}W_x$/Pt ($0 \leq x \leq 1$), $Ti_{1-x}W_x$/Ru ($0 \leq x \leq 1$), $Ti_{1-x}W_x$/Ir ($0 \leq x \leq 1$), Ta/Pt, $Ta_{1-x-y}Si_xN_y$Ir ($0 \leq x \leq 1$, $0 \leq y \leq 1$), $Ta_{1-x-y}Si_xN_y$/Pt ($0 \leq x \leq 1$, $0 \leq y \leq 1$), $Ta_{1-x-y}Si_xN_y$/Ru ($0 \leq x \leq 1$, $0 \leq y \leq 1$), $Ti_{1-x}N_x$/Ir ($0 \leq x \leq 1$), $Ti_{1-x}N_x$/Pt ($0 \leq x \leq 1$), $Ti_{1-x}N_x$/Ru ($0 \leq x \leq 1$), $Ta_{1-x}N_x$/Ir ($0 \leq x \leq 1$), $Ta_{1-x}N_x$/Pt ($0 \leq x \leq 1$), $Ta_{1-x}N_x$/Ru ($0 \leq x \leq 1$), $Ti_{1-x-y}Al_xN_y$/Pt ($0 \leq x \leq 1$, $0 \leq y \leq 1$), $Ti_{1-x-y}Al_xSi_y$/Ru ($0 \leq x \leq 1$, $0 \leq y \leq 1$), $Ti_{1-x-y}Al_xSi_y$/Ir ($0 \leq x \leq 1$, $0 \leq y \leq 1$), $Ir/IrO_2$/Pt, W, Ni, Mo, Au,Cu, Ti/Pt/Al, Ti/Ag, Ti/Ag/Ti, Ti/Ag/Ir, Ti/Ir, Ti/Pd, $Ti/Ag_{1-x}Pt_x$ ($0 \leq x \leq 1$), $Ti/Ag_{1-x}Pd_x$ ($0 \leq x \leq 1$), $Ag_{1-x}Pt_x$ ($0 \leq x \leq 1$), $Ti/Pt_{1-x}Al_x$ ($0 \leq x \leq 1$), $Pt_{1-x}Al_x$ ($0 \leq x \leq 1$), $Ti/Ag/Pt_{1-x}Al_x$ ($0 \leq x \leq 1$), Ti/Ag/Ru, Ru, $Ru/RuO_2$, Ti/Ru, Ti/Ir, $Ti/Ir/IrO_2$, $Ti/Ru/Ru_xPt_{1-x}$ ($0 \leq x \leq 1$), $Ti/Ag/Ir/IrO_x$ ($0 \leq x \leq 2$), $Ti/Ag/Ru/RuO_x$ ($0 \leq x \leq 2$), $Ti/Ag/Ru/Ru_xPt_{1-x}$ ($0 \leq x \leq 1$), $Ti/Ag/Ru/Ru_xPt_{1-x}/RuO_y$ ($0 \leq x \leq 1$, $0 \leq y \leq 2$), $Ti/Ag/Ru/RuO_x/Ru_yPt_{1-y}$ ($0 \leq x \leq 2$, $0 \leq y \leq 1$), $Ti/Ag/Ru_xPt_{1-x}$ ($0 \leq x \leq 1$), $Ti/Ag/Pt_xAl_{1-x}$ ($0 \leq x \leq 1$), $t_xAl_{1-x}$/$Ag/Pt_yAl_{1-y}$ ($0 \leq x \leq 1$, $0 \leq y \leq 1$), $Ti/Ag/Pt_y(RhO_x)_{1-y}$ ($0 \leq x \leq 2$, $0 \leq y \leq 1$), $Ti/Ag/Rh/RhO_x$ ($0 \leq x \leq 2$), Rh, $Rh/RhO_2$, $Ti/Ag/Pt_xRh_{1-x}$ ($0 \leq x \leq 1$), $Ti/Ag/Pt_y(RhO_x)_{1-y}$/$Pt_zRh_{1-z}$ ($0 \leq x \leq 2$, $0 \leq y \leq 1$, $0 \leq z \leq 1$), $Ti/Ag_xPt_{1-x}$/Ir ($0 \leq x \leq 1$), $Ti/Ag_xPt_{1-x}$/$Ir/IrO_y$ ($0 \leq x \leq 1$, $0 \leq y \leq 2$), $Ti/Ag_xPt_{1-x}$/$Pt_yAl_{1-y}$ ($0 \leq x \leq 1$, $0 \leq y \leq 1$), $Ti/Ag_xPt_{1-x}$/Ru ($0 \leq x \leq 1$), $Ti/Ag_xPt_{1-x}$/$Ru/RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, $Ti/Rh/RhO_2$, Ti/Ni/Al/ITO, Ti/Ni or Ti/W/Ti. The second electrically conducting layer 10 is structured such that it forms the second electrode of the large capacitor. The first dielectric layer 7 forms the dielectric of the large capacitor in the region between the first electrically conducting layer 6 and the second electrically conducting layer 10. A protective layer 11, for example made of an organic or an inorganic material or a combination of inorganic materials, or a combination of organic and inorganic materials, is provided over the entire circuit arrangement. The organic material used may be, for example, polybenzocyclobutene or polyimide, and the inorganic material may be, for example, SiN(H), $SiO_2$, or $Si_xO_yN_z$ ($0 \leq x \leq 1$, $0 \leq y \leq 1$, $0 \leq z \leq 1$). The protective layer 11 has openings which define an input 12 and an output 13 of the circuit arrangement. The second semiconductor region 3 of the pn diode is electrically connected to the input 12 of the circuit arrangement and the second electrically conducting layer 10 via a first current supply lead 8. The first electrically conducting layer 6 is preferably electrically connected to the output 13 of the circuit arrangement via a second current supply lead 9. The first current supply lead 8 and the second current supply lead 9 preferably comprise the same material as the second electrically conducting layer 10.

Alternatively, a serial capacitor may be manufactured. For this purpose, the first electrically conducting layer is not contacted by the current supply lead 9. The current supply lead 9 is connected directly to the output 13 in this case.

Figure 2:
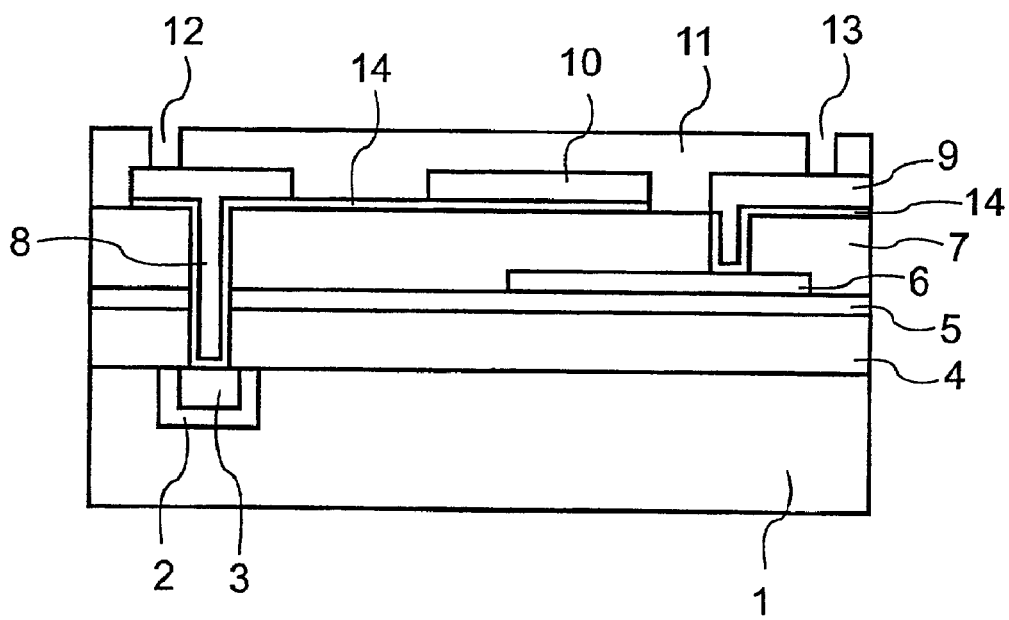
FIG. 2 is a diagrammatic cross-sectional view of a semiconducting substrate with a diode, a capacitor, and a resistor.

FIG. 2 shows a portion of a possible embodiment of the invention with a circuit arrangement with diodes and a capacitor-resistor network. FIG. 2 is a diagrammatic cross-sectional view of a semiconducting substrate 1 with a pn diode, a large capacitor, and a resistor. For this purpose, the electronic component in addition comprises a resistance layer 14 which is provided on the first dielectric layer 7. The resistance layer 14 may comprise, for example, β-Ta, $Ta_xN_y$ ($0 \leq x \leq 1$, $0 \leq y \leq 1$), poly-Si, $Ni_xCr_y$ ($0 \leq x \leq 1$, $0 \leq y \leq 1$), $Ni_xCr_yAl_z$ ($0 \leq x \leq 1$, $0 \leq y \leq 1$, $0 \leq z \leq 1$), $Ti_xW_yN_z$ ($0 \leq x \leq 1$, $0 \leq y \leq 1$, $0 \leq z \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), $Ti_xW_y$ ($0 \leq x \leq 1$, $0 \leq y \leq 1$), $Ta_{1-x-y}Si_xN_y$, ($0 \leq x \leq 1$, $0 \leq y \leq 1$), $Ti_{1-x-y}Al_xN_y$ ($0 \leq x \leq 1$, $0 \leq y \leq 1$), $Ti_{1-x}N_x$ ($0 \leq x \leq 1$) or $Cu_xNi_y$ ($0 \leq x \leq 1$, $0 \leq y \leq 1$). The second electrically conducting layer 10 and the resistance layer 14 form the second electrode of the large capacitor in the region of the second electrically conducting layer 10. Furthermore, the resistance layer 14 is provided also in the region of the first current supply lead 8 and the second current supply lead 9, thus serving for electrical contacting of the individual components of the circuit arrangement. In this embodiment, the second semiconductor region 3 of the pn diode is electrically connected to the input 12 of the circuit arrangement and to the resistor via the first current supply lead 8 and the resistance layer 14.

Figure 3:
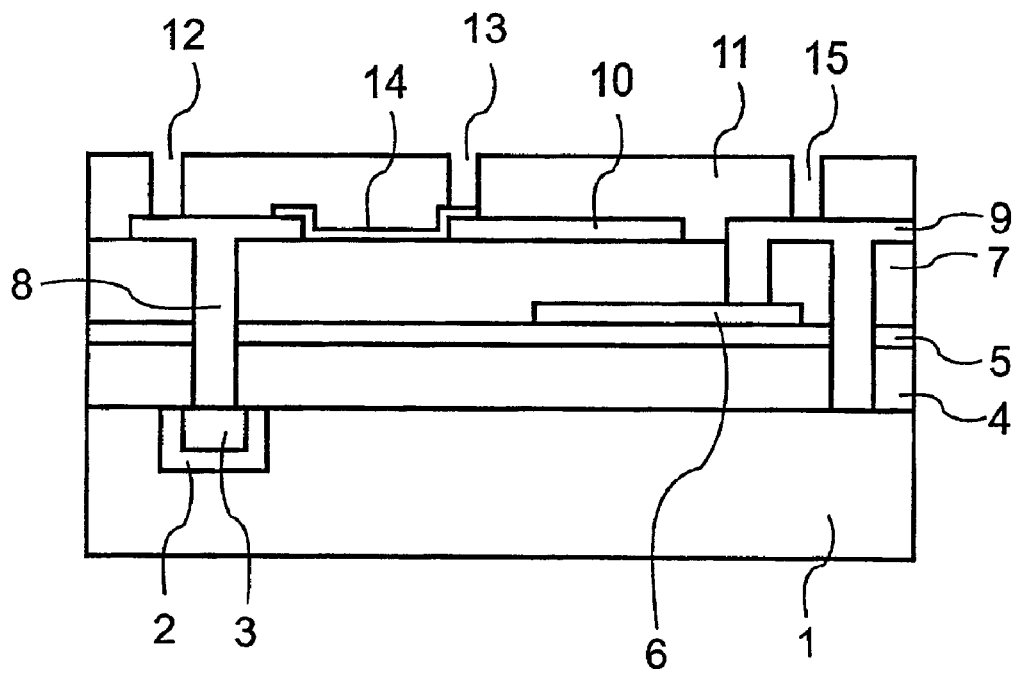
FIG. 3 is a further diagrammatic cross-sectional view of a semiconducting substrate with a diode, a capacitor, and a resistor.

FIG. 3 shows a portion of a further embodiment of the invention with a circuit arrangement with diodes and a capacitor-resistor network. FIG. 3 again is a diagrammatic cross-sectional view of a semiconductor substrate 1 with a pn diode, a large capacitor, and a resistor. In contrast to the embodiment of FIG. 1, the resistance layer 14 in this embodiment is structured such that it is only provided in the region where a resistor is to be present. The resistance layer 14 in this embodiment, and accordingly the resistor, is electrically connected to the input 12 of the circuit arrangement and to the second semiconductor region 3 of the pn diode via the first current supply lead 8. In addition, the resistance layer 14 is electrically connected to the output 13 of the circuit arrangement and the second electrically conducting layer 10. The first electrically conducting layer 6 is electrically connected via the second current supply lead 9 to the ground terminal 15, which is defined by a further opening in the protective layer 11, and to the semiconducting substrate 1.

Figure 4:
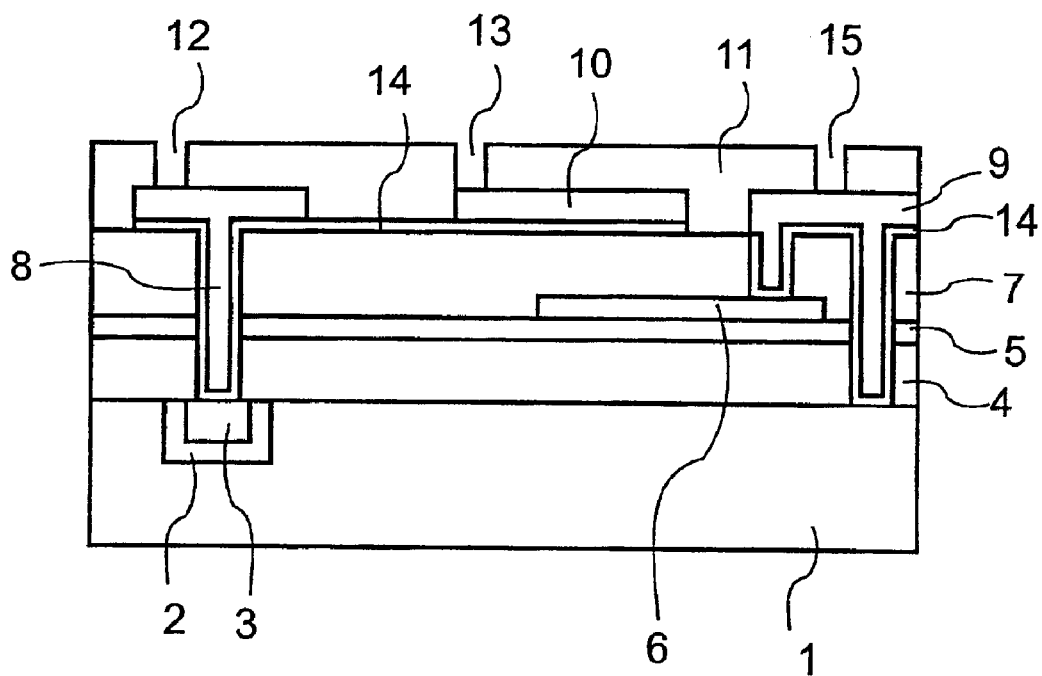
FIG. 4 is a different diagrammatic cross-sectional view of a semiconducting substrate with a diode, a capacitor, and a resistor.

FIG. 4 shows a further possible embodiment of the invention with a circuit arrangement with diodes and a capacitor-resistor network. FIG. 4 is a diagrammatic cross-sectional view of a semiconducting substrate 1 with a pn diode, a large capacitor, and a resistor. In contrast to the embodiment shown in FIG. 3, the resistance layer 14 is provided not only in the region where the resistor is present, but this resistance layer 14 is also present in the region of the first current supply lead 8, in the region of the second current supply lead 9, as well as between the first dielectric layer 7 and the second electrically conducting layer 10. In the region of the second electrically conducting layer 10, said layer 14 forms together with said layer 10 the second electrode of the large capacitor. Furthermore, the resistance layer 14 is also provided in the region of the first current supply lead 8 and the second current supply lead 9, thus also serving for electrical contacting of the individual components of the circuit arrangement.

Figure 5:
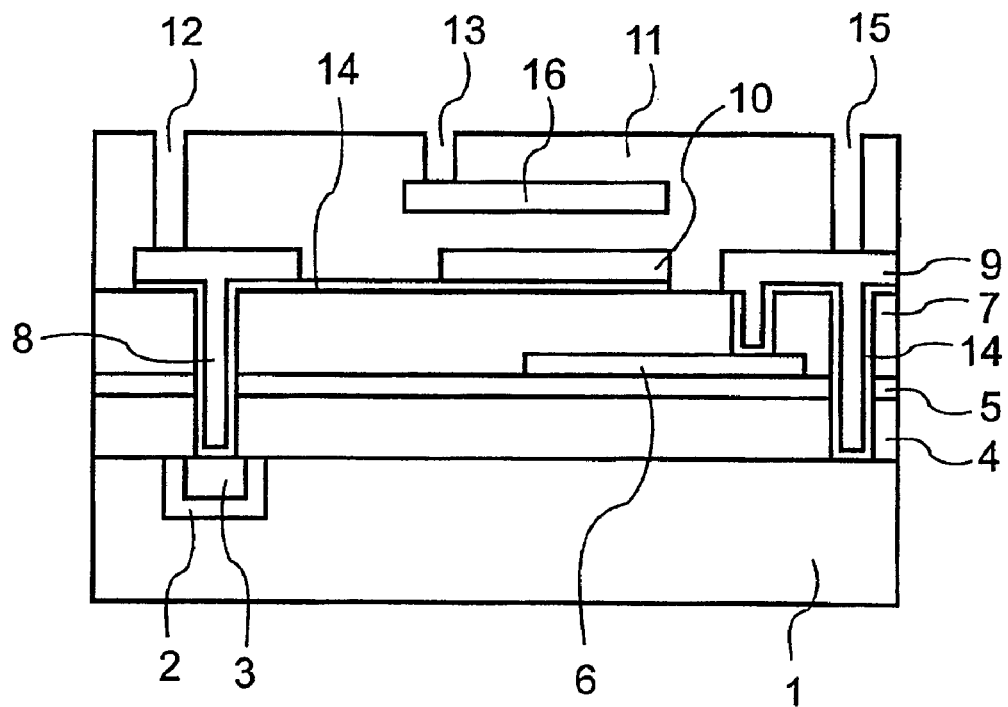
FIG. 5 is a diagrammatic cross-sectional view of a semiconducting substrate with a diode, capacitors, and a resistor.

FIG. 5 shows a further possible embodiment of the invention with a circuit arrangement with diodes and a capacitor-resistor network. FIG. 5 is a diagrammatic cross-sectional view of a semiconducting substrate 1 with a pn diode, a large capacitor, a resistor, and a further, small capacitor. For this purpose, the electronic component comprises a third electrically conducting layer 16 in addition to those shown in the embodiment of FIG. 4, which third electrically conducting layer is embedded in the protective layer 11. The third electrically conducting layer 16 is structured such that it forms the small capacitor together with the second electrically conducting layer 10 and with the material of the protective layer 11 lying between the two electrically conducting layers 10, 16. In this embodiment, the protective layer 11 comprises only inorganic materials, such as for example, $SiO_2$ or SiN(H), or combinations of these materials. The capacitance density of the small capacitor is defined by the low dielectric constant $\epsilon_r$ of these materials and is thus lower than that of the large capacitor. In this embodiment, the output 13 is connected to the third electrically conducting layer 16.

Alternatively, the dielectric of the small capacitor may be formed by a separate dielectric layer which comprises, for example, $Al_2O_3$, $Ta_2O_5$, $(Ta_2O_5)_x\text{-}(Al_2O_3)_{1-x}$ ($0 \leq x \leq 1$), $(Ta_2O_5)_x\text{-}(TiO_2{}_{1-x}$ ($0 \leq x \leq 1$), $(Ta_2O_5)_x\text{-}(Nb_2O_5{}_{1-x}$ ($0 \leq x \leq 1$), $(Ta_{O5})_x\text{-}(SiO_2)_{1-x}$ ($0 \leq x \leq 1$) or $TiO_2$. On this separate dielectric layer lies the third electrically conducting layer 16 which comprises, for example, Al, Al doped with Si, Al doped with Cu, $W_xTi_{1-x}/Al(Cu)$ ($0 \leq x \leq 1$), $W_xTi_{1-x}/Al$ (Si) ($0 \leq x \leq 1$), $W_xTi_{1-x}/Al$ ($0 \leq x \leq 1$), $Ni_xCr_yAl_z/Al$ ($0 \leq x \leq 1$, $0 \leq y \leq 1$, $0 \leq z \leq 1$), $Ni_xCr_yAl_z/Al$ doped with Cu ($0 \leq x \leq 1$, $0 \leq y \leq 1$, $0 \leq z \leq 1$), $Ni_xCr_yAl_z/Al$ doped with Si ($0 \leq x \leq 1$, $0 \leq y \leq 1$, $0 \leq z \leq 1$), or Ti/Cu. The protective layer 11 is provided on the third electrically conducting layer 16 and those regions of the separate dielectric layer which are not covered by the third electrically conducting layer 16.

Figure 6:
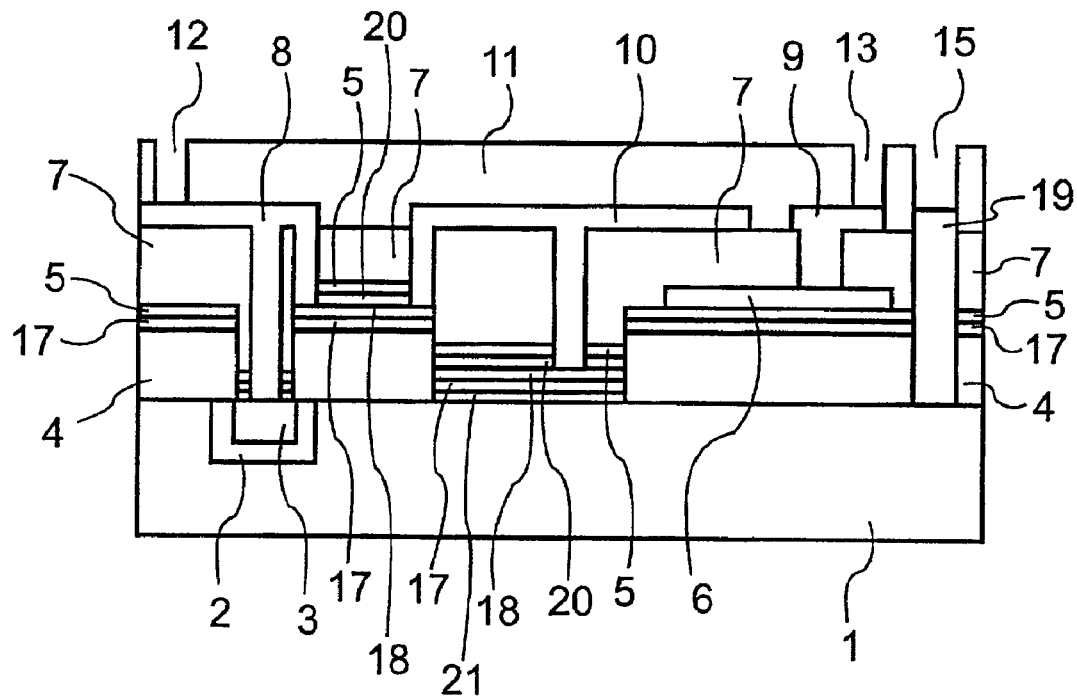
FIG. 6 is a further diagrammatic cross-sectional view of a semiconducting substrate with a diode, capacitors, and a resistor.

FIG. 6 shows a portion of another possible embodiment of the invention with a circuit arrangement with diodes and a capacitor-resistor network. FIG. 6 is a diagrammatic cross-sectional view of a semiconducting substrate 1 with a pn diode, a large capacitor, a resistor, and a small capacitor. This electronic component again comprises a semiconducting substrate 1 with first semiconductor regions 2 and second semiconductor regions 3. The insulating layer 4 is interrupted in some regions. A thin oxide layer 21, preferably made of $SiO_2$, is present in those regions where no insulating layer 4 lies on the semiconducting substrate 1. A second dielectric layer 17, for example comprising SiN(H), is present on the insulating layer 4 and the oxide layer 21. A fourth electrically conducting layer 18 is present in some regions on the second dielectric layer 17. The material of the fourth electrically conducting layer 18 shows a certain resistance and may comprise, for example, Ta. The fourth electrically conducting layer 18 acts as a resistor in some regions and as the second electrode of the small capacitors in other regions. An anti-reaction layer 20, for example made of SiN(H) or $SiO_2$, is provided on the fourth electrically conducting layer 18. The barrier layer 5 lies on the anti-reaction layer 20 and on the second dielectric layer 17, as applicable. The first electrically conducting layer 6 is provided on the barrier layer 5 in some regions. The first dielectric layer 7 lies on the first electrically conducting layer 6 and on those regions of the barrier layer 5 which are not covered by the first electrically conducting layer 6. The second electrically conducting layer 10 is provided on some regions of the first dielectric layer 7. The protective layer 11 is provided over the entire circuit arrangement. The second semiconductor region 3 of the diode is electrically connected via the first current supply lead 8 to the input 12 of the circuit arrangement and to that region of the fourth electrically conducting layer 18 which acts as a resistor. The resistor is furthermore connected electrically to the second electrically conducting layer 10. In another region, the fourth electrically conducting layer 18 forms the second electrode of the small capacitor. The first electrode of each small capacitor is formed by the semiconducting substrate 1, and the regions of the oxide layer 21 and of the second dielectric layer 17 lying between the electrically conducting layer 18 and the semiconducting substrate 1 form the dielectric of the small capacitors. The first electrically conducting layer 6 of the large capacitor is electrically connected to the output 13 of the circuit arrangement via the second current supply lead 9. The semiconductor substrate 1 is electrically connected to the ground terminal 15 of the circuit arrangement via a third current supply lead 19.

Alternatively, the second dielectric layer 17 may be directly provided on those regions of the semiconductor substrate 1 which are not covered by the insulating layer.

Figure 7:
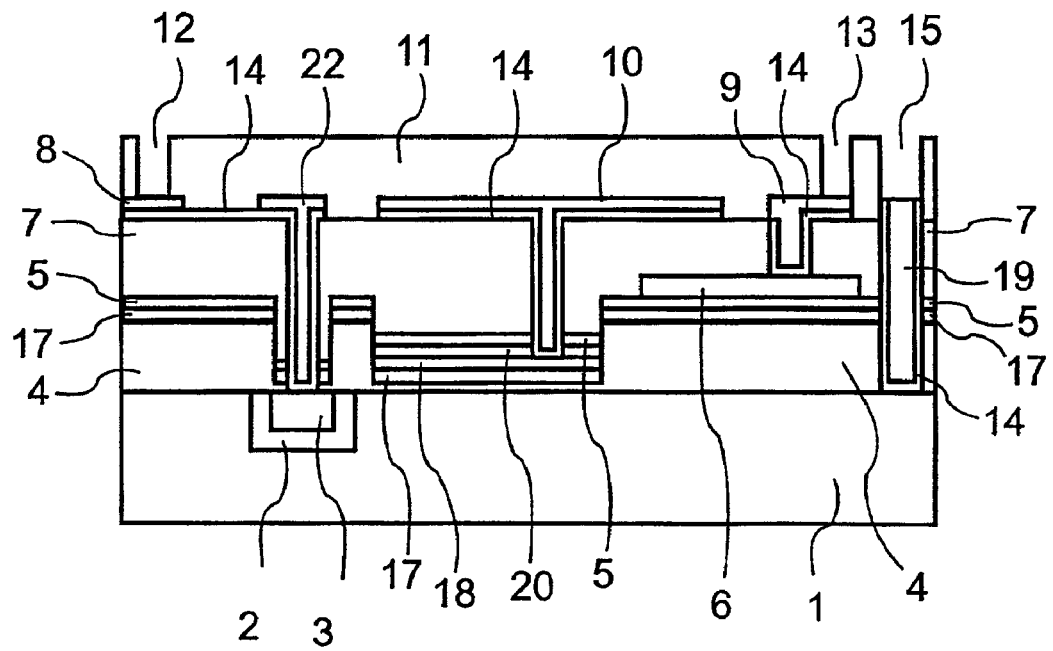
FIG. 7 is another diagrammatic cross-sectional view of a semiconducting substrate with a diode, capacitors, and a resistor.

FIG. 7 shows a portion of another possible embodiment of the invention which a circuit arrangement with diodes and a capacitor-resistor network. FIG. 7 is a diagrammatic cross-sectional view of a semiconducting substrate 1 with a pn diode, a large capacitor, a resistor, and a further, small capacitor. In contrast to the embodiment shown in FIG. 6, the fourth electrically conducting layer 18 in this embodiment acts as the second electrode of the small capacitors, and the resistor is formed by the separate resistance layer 14 which is provided on the first dielectric layer 7. The fourth electrically conducting layer 18 in this embodiment comprises a material without appreciable resistance such as, for example, polycrystalline silicon. In this embodiment, the resistance layer 14 is electrically connected to the input of the circuit arrangement 12 via the current supply lead 8. A first connection line 22, which preferably comprises the same material as the second electrically conducting layer 10, connects a resistance layer 14 to the second semiconductor region 3 of a pn diode. Not shown in FIG. 7 is that the resistance layer 14 and the second semiconductor region 3 of a pn diode are connected to the second electrically conducting layer 10 via the first connection line 22. The fourth electrically conducting layer 18 is electrically contacted by the second electrically conducting layer 10. In this embodiment, furthermore, the resistance layer 14 is deposited not only in those regions where respective resistors are to be present, but also in the regions of the first current supply leads 8, the first connection lines 22, the second electrically conducting layers 10, the second current supply leads 9, and the third current supply leads 15. In those locations it serves for electrical contacting of the individual components of the circuit arrangement.

Alternatively, the second dielectric layer 17 may be provided directly on those regions of the semiconducting substrate 1 which are not covered by the insulating layer. Furthermore, it is possible for the resistance layer 14 to be present only where a resistor is to be present.

Figure 8:
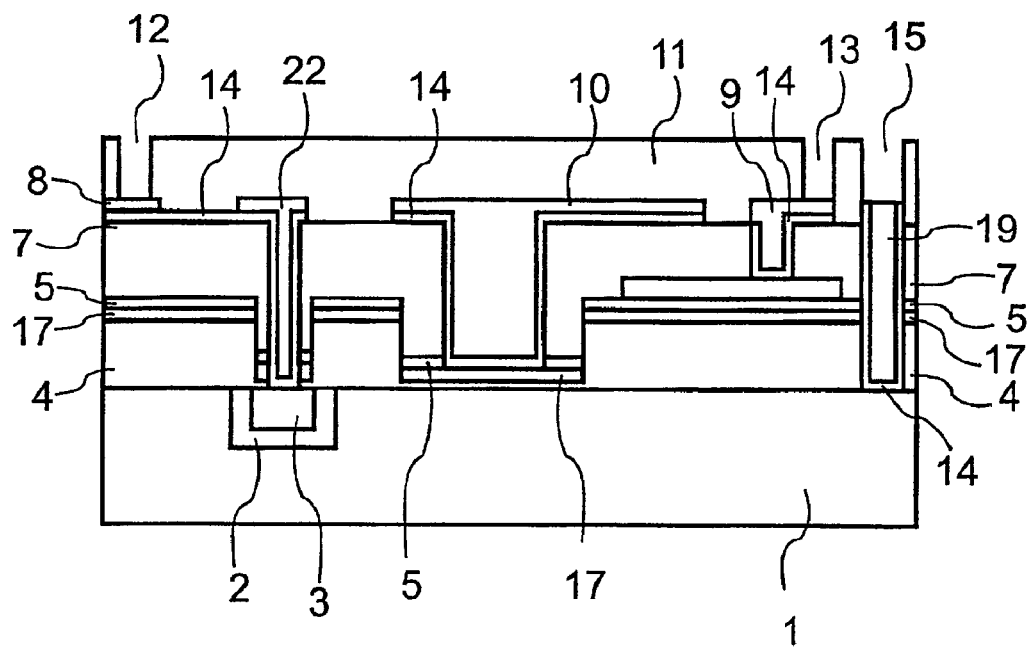
FIG. 8 is yet another diagrammatic cross-sectional view of a semiconducting substrate with a diode, capacitors, and a resistor.

FIG. 8 shows a portion of another possible embodiment of the invention with a circuit arrangement with diodes and a capacitor-resistor network. FIG. 8 is a diagrammatic cross-sectional view of a semiconducting substrate 1 with a pn diode, a large capacitor, a resistor, and a small capacitor. In contrast to the embodiment shown in FIG. 7, the second electrode of the further capacitor is not formed by a separately deposited, fourth electrically conducting layer 18, but by a suitably structured second electrically conducting layer 10.

Alternatively, the second dielectric layer 17 may be provided directly on those regions of the semiconducting substrate 1 which are not covered by the insulating layer. Furthermore, the resistance layer 14 may be present only in those locations where a resistor is to be present later. In all embodiments the large capacitor and/or the small capacitor is a multi layer stack capacitor.

Figure 9:
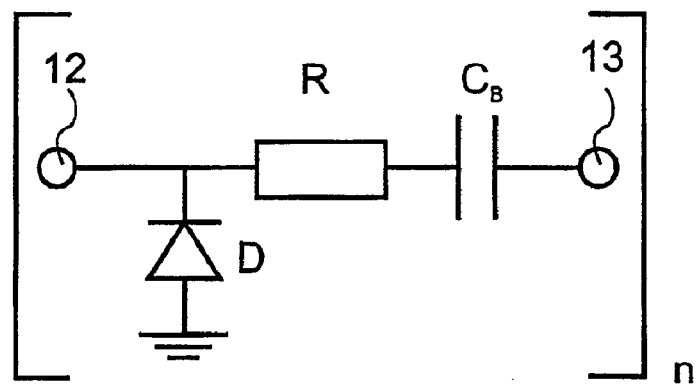
FIGS. 9 to 15 show possible circuit arrangements.

FIG. 9 shows a possible circuit arrangement for a network comprising at least a diode D, a resistor R, and a large capacitor $C_B$. A resistor R and a capacitor $C_B$ are present between an input 12 and an output 13. The resistor is connected to the input 12 here, and the capacitor $C_B$ to the output 13. The diode D lies between the input 12 and ground. It is true for n that n=1, 2, 3, 4, . . . ∝.

Figure 10:
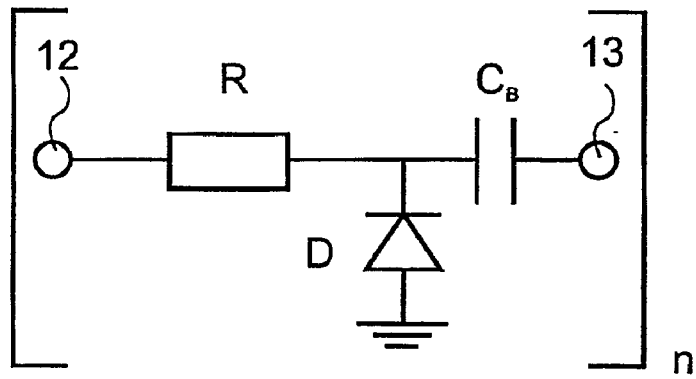

FIG. 10 shows a further possible circuit arrangement of a network with at least a diode D, a resistor R, and a large capacitor $C_B$. In this embodiment, the diode D is connected between the resistor R and the capacitor $C_B$. The second terminal of the diode D is connected to ground. It is true for n that n=1, 2, 3, 4, . . . ∝.

Figure 11:
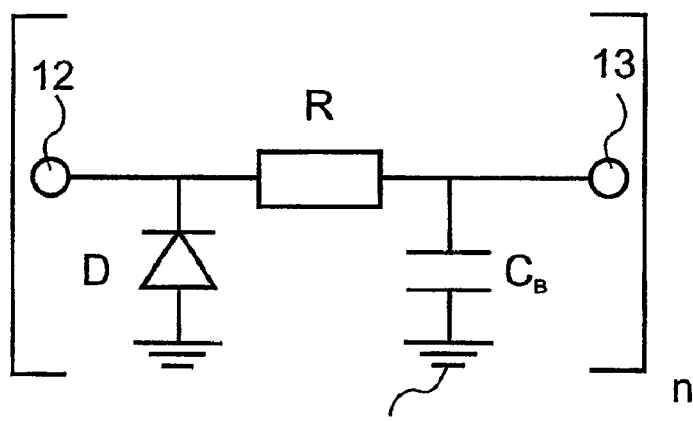

FIG. 11 shows a further possible circuit arrangement of a network of at least a diode D, a resistor R, and a large capacitor $C_B$. A resistor R is connected between an input 12 and an output 13. The diode D is connected between the input 12 and ground. The first terminal of the capacitor $C_B$ lies between the resistor R and the output 13. The second terminal of the capacitor $C_B$ is connected to the ground terminal 15. It is true for n that n=1, 2, 3, 4, . . . ∝.

Figure 12:
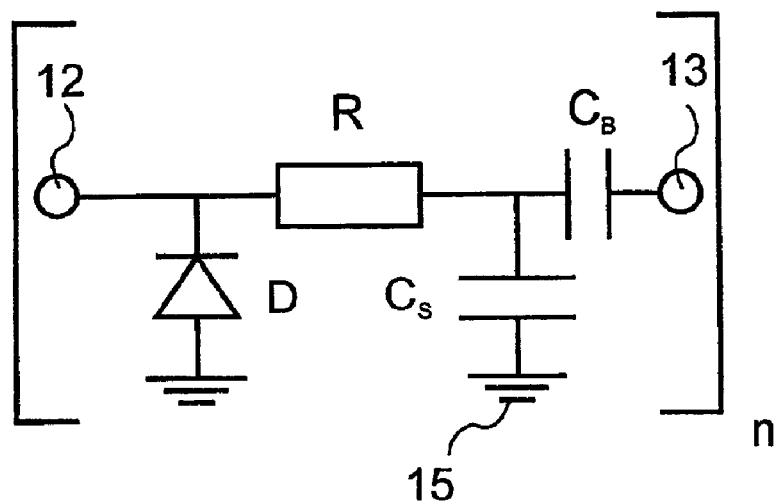

FIG. 12 shows a possible circuit arrangement of a network with at least a diode D, a resistor R, a large capacitor $C_B$, and a small capacitor $C_S$. The resistor R and the large capacitor $C_B$ are connected between the input 12 and the output 13 of the circuit arrangement. The resistor R is connected to the input 12, and the capacitor $C_B$ is connected to the output 13. The diode D lies between the input 12 and ground. The first terminal of the small capacitor $C_S$ lies between the resistor R and the large capacitor $C_B$. The second terminal of the small capacitor $C_S$ is connected to the ground terminal 15. It is true for n that n=1, 2, 3, 4, . . . ∝.

Alternatively, the small capacitor $C_S$ may be connected between the resistor R and the output 13. In that case the first terminal of the large capacitor $C_B$ is connected between the resistor R and the small capacitor $C_S$, and the second terminal is connected to the ground terminal 15.

Figure 13:
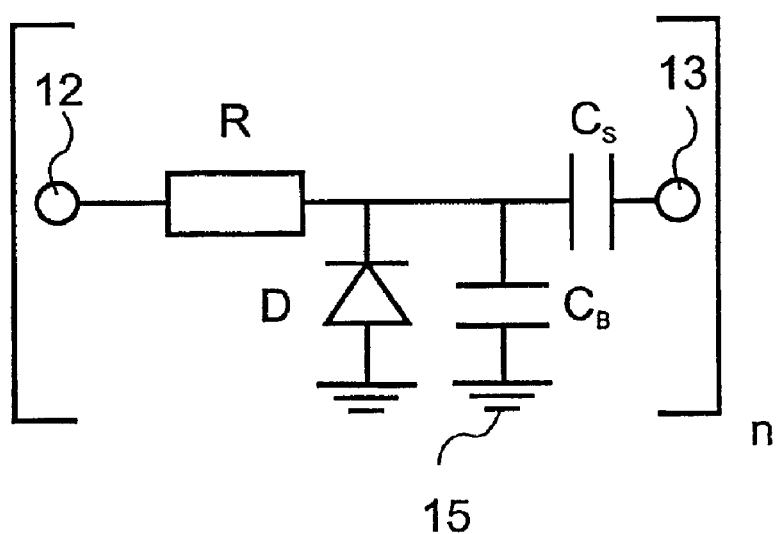

FIG. 13 shows a further possible circuit arrangement of a network with at least a diode D, a resistor R, a capacitor $C_B$, and a small capacitor $C_S$. The resistor R and the small capacitor $C_S$ are connected between the input 12 and the output 13 of the circuit arrangement. The resistor R is here connected to the input 12, and the small capacitor $C_S$ to the output 13. The diode D lies between the resistor R and ground. The first terminal of the large capacitor $C_B$ lies between the resistor R and the small capacitor $C_S$. The second terminal of the large capacitor $C_B$ is connected to the ground terminal 15. It is true for n that n=1, 2, 3, 4, . . . ∝.

Alternatively, a circuit arrangement with diodes and a capacitor-resistor network may comprise varying numbers of individual components. Thus, for example, the total number of the large capacitors may be smaller than the total number of the diodes and the total number of the resistors. Furthermore, the circuit arrangement may comprise a wide variety of combinations of diodes, large capacitors, small capacitors, and resistors, in widely differing arrangements.

Figure 14:
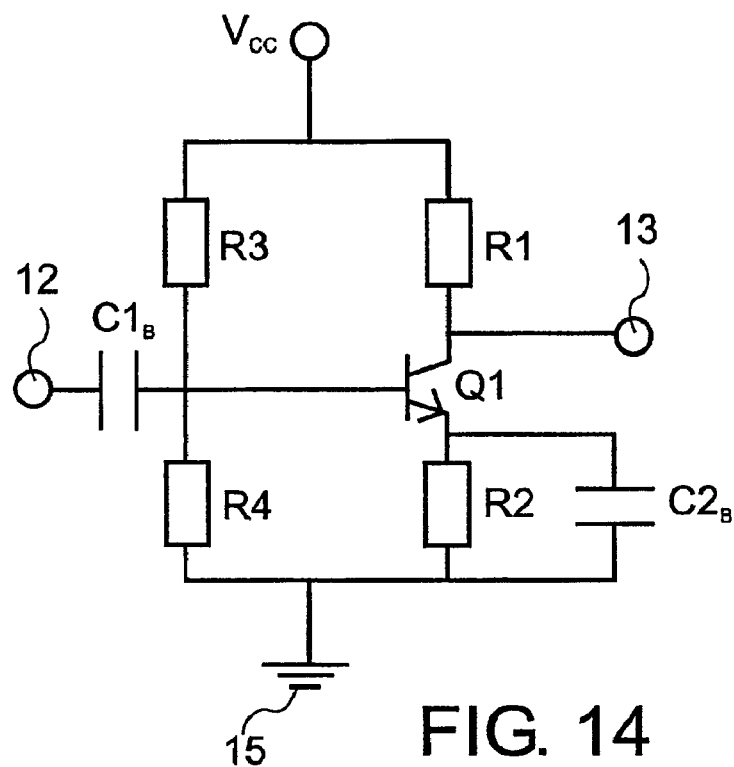

FIG. 14 shows a possible circuit arrangement with a transistor Q and a network of resistors R and large capacitors $C_B$. In this circuit arrangement, the input 12 is connected to the base of a transistor Q1 via a capacitor $C1_B$. The output 13 is connected to the collector of the transistor Q1. Between the emitter of the transistor Q1 and the ground terminal 15 there is a resistor R2 with a parallel capacitor $C2_B$. The ground terminal 15 is connected to the collector of Q1 via two series resistors R3 and R4 and a power input terminal $V_{CC}$ as well as a further resistor R1.

Figure 15:
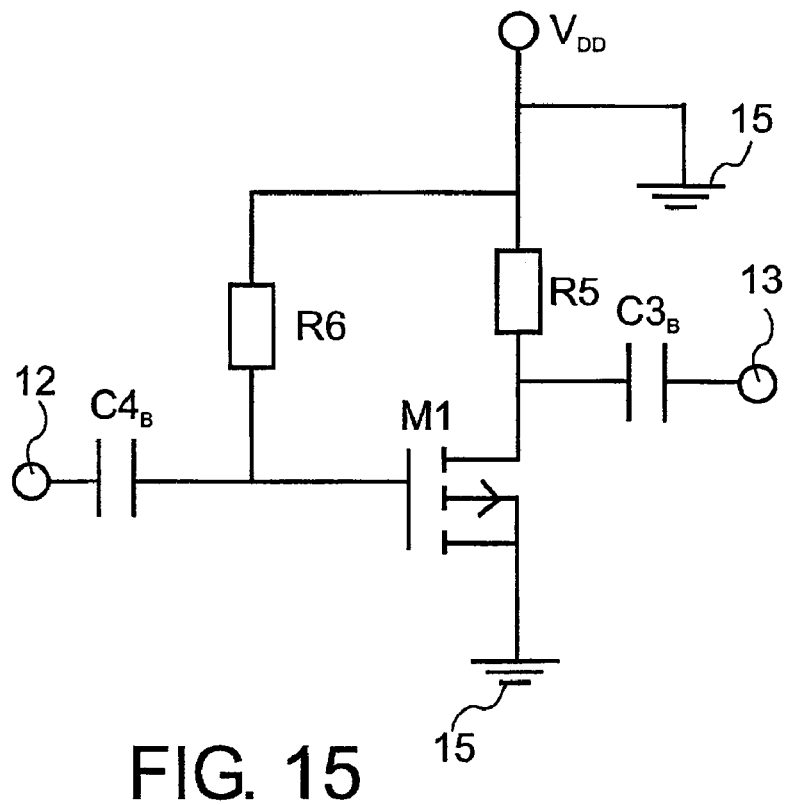

FIG. 15 shows a possible circuit arrangement with a field effect transistor (FET) and a network of resistors R and large capacitors $C_B$. The input 12 is connected to the gate of the FET M1 via a capacitor $C4_B$. The source of the FET M1 is connected to the ground terminal 15. The output 13 is connected to the drain of the FET M1 via a capacitor $C3_B$. A supply voltage source $V_{DD}$ is furthermore provided, connected at one side to the drain electrode of the FET M1 via a resistor R5 and at another side to the ground terminal 15 via a capacitor $C5_B$. The gate of the FET M1 is connected to the supply voltage source $V_{DD}$ via a resistor R6.

Alternatively, the circuit arrangement may comprise networks of large capacitors or networks of resistors, large capacitors, and small capacitors.

The diodes are manufactured first in the manufacture of a circuit arrangement with diodes and large capacitors. For manufacturing pn diodes, a semiconducting substrate 1 comprising a dopant of a first doping type with a first doping density n1 is first coated with an epitaxial silicon layer comprising a dopant of the first doping type with a second doping density n2. The second doping density n2 may be smaller than, equal to, or greater than the first doping density n1. A thin oxide layer of $SiO_2$ is provided on the eptiaxial silicon layer and is structured such that the oxide layer remains where the first semiconductor regions 2 are to be present. Atoms of the dopant of the first doping type are implanted and diffused into the regions of the epitaxial silicon layer not covered by the oxide layer, so that a semiconducting substrate 1 with the dopant of the first doping type with a first doping density n1 arises which comprises first semiconductor regions 2 which comprise the dopant of the first doping type with a doping density n2. Openings are made to the first semiconductor regions 2 in the oxide layer formed in the diffusion process. This may be done by means of lithography structuring processes and/or wet-chemical etching processes. Atoms of the dopant of the second doping type are implanted and diffused into the exposed first semiconductor regions 2, such that a smaller, second semiconductor region 3 is created in each first semiconductor region 2, which second region 3 comprises the dopant of the second doping type with a doping density n3. In this diffusion process, a layer of $SiO_2$ is grown in the openings which together with the oxide layer already present on the semiconducting substrate 1 forms the insulating layer 4. The barrier lay 5 is provided on the insulating layer 4, preferably in a sputtering process. The first electrically conducting layer 6 is deposited on the barrier layer 5 and is structured, for example by means of reactive ion etching, such that it forms the first electrode of the large capacitors. The first dielectric layer 7 is provided on this assembly, for example by means of a spinning process. Openings are etched into the first dielectric layer 7 down to the regions of the first electrically conducting layer 6 which each form the first electrode of a large capacitor, by means of wet-chemical or dry etching processes. In addition, openings are etched to the second semiconductor regions 3. For this purpose, openings are created which extend through the first dielectric layer 7, the barrier layer 5, and the insulating layer 4. A second electrically conducting layer 10 is deposited on the first dielectric layer 7 and is structured such that it acts as the second electrode of the large capacitor and as a connecting line between the individual components of the circuit arrangement. Preferably, the same material is also deposited in the openings, thus creating a first current supply lead 8 and a second current supply lead 9. This may alternatively be done in combination with the deposition of the second electrically conducting layer. A protective layer 11 is provided over the entire assembly, for example through deposition in the gas phase or a spinning process. Openings are etched into the protective layer 11, by means of wet-chemical or dry etching processes, defining the input 12 and the output 13 of the circuit. Bump contacts of, for example, NiV/Cu/Pb$_{1-x}$Sn$_x$ ($0 \leq x \leq 1$) are grown for electrical contacting of the input 12 and the output 13.

Small openings are etched to the first electrically conducting layer 6 in the manufacture of series capacitors.

For the manufacture of a circuit arrangement with diodes, resistors, and large capacitors, the resistance layer 14 is deposited on the first dielectric layer 7 and in the openings before the deposition of the second electrically conducting layer 10. The resistance layer 14 is structured such that is forms the resistors. The resistance layer 14 is structured in the region of the electrically conducting layer 10 such that it forms the second electrode of the large capacitor in conjunction with the second electrically conducting layer 10. The second electrically conducting layer 10 also serves for electrical contacting of the individual components and of the input 12 and the output 13 in the regions of this first current supply lead 8 and this second current supply lead 9.

Alternatively, the resistance layer 14 may be structured, before the deposition of the second electrically conducting layer 10, by means of lithographic or wet-chemical etching processes such that it remains on the first dielectric layer 7 only in those locations where the resistors are to be created. In a further alternative embodiment, the second electrically conducting layer 10 is first provided and structured. Then the resistance layer 14 is deposited on the electrically conducting layer 10 and structured.

If the large capacitor is to be connected to ground, then an opening is etched to the semiconducting substrate 1 in addition to the openings to the first electrically conducting layer 6 and the second semiconductor regions 3, and this opening is filled with an electrically conducting material. Furthermore, a further opening is etched into the protective layer 11 in addition to the input 12 and the output 13, which opening defines the ground connection 15 of the circuit arrangement. The current supply leads 9 each connect the first electrode of a large capacitor to a ground terminal 15.

For the manufacture of a circuit arrangement with diodes, resistors, large capacitors, and small capacitors, a third structured electrically conducting layer 16 is embedded in the protective layer 11. For this purpose, only a first portion of the material of the protective layer 1 is initially deposited over the entire assembly. The third electrically conducting layer 16 is deposited on this portion and is structured such that it acts as the second electrode of the small capacitors. Then the remaining material of the protective layer 11 is deposited on this assembly. Alternatively, a separate dielectric layer may be deposited instead of the first portion of the material of the protective layer 11, on which separate layer the third electrically conducting layer is deposited. Then the protective layer 11 is deposited over the entire assembly.

In another possibility for the manufacture of a circuit arrangement with diodes, resistors, large capacitors, and small capacitors, openings are etched into the insulating layer 4 down to the semiconducting substrate 1 after the manufacture of the diodes in the semiconducting substrate 1. Additional openings may also be etched to the semiconductor regions 3. An insulating layer 4 is grown again in these openings by means of a thermal process, the layer thickness thereof being smaller than that of the remaining insulating layer 4. The second dielectric layer 17 is deposited over the entire assembly. A fourth electrically conducting layer 18 with a certain resistance value is deposited on the second dielectric layer 17 and is structured such that it remains in the region of those openings which originally reached down to the semiconducting substrate as well as in those regions where a resistor is to be present. The anti-reaction layer 20 is provided on said fourth electrically conducting layer 18 with resistance value. The barrier layer 5 is provided over this entire structure. The first electrically conducting layer 6 is provided on the barrier layer 5 and is structured in accordance with the embodiment of the circuit arrangement as described above. The first dielectric layer 7 is provided over this entire assembly. Openings are etched into the first dielectric layer 7 down to the first electrically conducting layer 6 by means of wet-chemical or dry etching processes. In addition, openings are etched to the second semiconductor regions 3, to the fourth electrically conducting layer 18 with resistance value, and to the semiconducting substrate 1. A second electrically conducting layer 10 is deposited on the first dielectric layer 7 and is structured such that it serves as the second electrode of the large capacitor and as a connection line interconnecting the individual components of the circuit arrangement. The same material is preferably also deposited in the openings, thus creating the first current supply lead 8, the second current supply lead 9, and the third current supply lead 19. A protective layer 11 is provided over the entire assembly, and openings are etched into the protective layer 11 so as to define the input 12, the output 13, and the ground terminal 15 of the circuit arrangement.

Bump contacts are grown for electrical contacting of the input 12, the output 13, and the ground terminal 15.

The dielectric for the small capacitors may alternatively comprise only the second dielectric layer 17. In that case, no insulating layer 4 is grown between the semiconductor substrate 1 and the second dielectric layer 17.

Alternatively, the resistors may be manufactured through deposition of a separate resistance layer 14. For this purpose, the fourth electrically conducting layer 18 is provided only in those openings which originally reached down to the semiconducting substrate 1. After the first dielectric layer 7 has been provided and the openings have been created, the resistance layer 14 is first deposited and structured. After that, the second electrically conducting layer 10 is deposited and structured. The current supply leads 8, 9, and 19 are manufactured after that or simultaneously therewith.

According to a further possibility for manufacturing a circuit arrangement with diodes, resistors, large capacitors, and small capacitors, openings are etched into the insulating layer 4 down to the semiconducting substrate 1 after the manufacture of the diodes in the semiconducting substrate 1. Additionally, openings may also be etched to the semiconductor regions 3. An insulating layer 4, whose thickness is smaller than that of the remaining insulating layer 4, is then grown again over the entire assembly and thus also in said openings. Then the second dielectric layer 17 and, on the second dielectric layer 17, the barrier layer 5 are deposited. The first electrically conducting layer 6 is provided on the barrier layer 5 and structured. The first dielectric layer 7 is provided over this entire assembly. Openings may be etched into the first dielectric layer 7 down to the first electrically conducting layer 6 by means of wet-chemical or dry etching processes. In addition, openings are etched to the second semiconductor regions 3 and to the semiconducting substrate 1. Furthermore, openings are etched to the second dielectric layer 17 with a shape such that they act as the second electrodes of the small capacitors after being filled with an electrically conducting material. A resistance layer 14 is deposited on the first dielectric layer 7 and is structured such that it remains in those locations where the resistors, where the second electrodes of the large capacitors, and where the current supply leads 8, 9, 19 are to be present. Then the second electrically conducting layer 10 is deposited. The electrically conducting layer 10 is structured such that it acts as the second electrode of the large capacitor and as a connection line interconnecting the individual components of the circuit arrangements. The same material is preferably also deposited in the openings, whereby the first current supply lead 8, the second current supply lead 9, the third current supply leads 19, and the second electrodes of the small capacitors are manufactured. A protective layer 11 is provided over the entire assembly, and openings are etched into the protective layer 11, defining the input 12, the output 13, and the ground terminal 15 of the circuit arrangement. Bump contacts are grown for electrical contacting of the input 12, the output 13, and the ground terminal 15.

Alternatively, the resistance layer 14 may be structured by means of lithographic or wet-chemical etching processes before deposition of the electrically conducting layer 10 such that this resistance layer remains only in those locations on the first dielectric layer 7 where the resistors are to be created. In a further alterative embodiment, the second electrically conducting layer 10 is provided and structured first. Then the resistance layer 14 is deposited on the electrically conducting layer 10 and is structured.

The dielectric for the small capacitors may alternatively comprise only the second dielectric layer 17. For this purpose, no insulating layer 4 is grown between the semiconductor substrate 1 and the second dielectric layer 17.

For the manufacture of a circuit arrangement with transistors and a network of large capacitors, of transistors and a network of large capacitors and resistors, or of transistors and a network of large capacitors, small capacitors, and resistors, the transistors are manufactured first by known methods. Then the capacitors and/or resistors are provided as described above and electrically interconnected in accordance with their applications. Alternatively, one or more current supply leads 8, 9, 19 and/or the first connection line 22 can be structured in such a way that they also act as inductance. In this case the circuit arrangement also comprises one or more inductance.

A finished electronic component may be provided, for example, with a standard semiconductor housing, a flip-chip housing, a plastic housing, a chip scale package, or a ceramic housing. Electrical contacting of the electronic component may take place by wire bonding or bump contacts. The bump contacts may comprise, for example, NiV/Cu/($Pb_{0.35}Sn_{0.65}$), NiV/Cu/($Pb_{0.4}Sn_{0.6}$) or NiCr/Cu/Ni/Au.

Embodiments of the invention will be explained in more detail below, representing examples of how the invention may be carried into practice.

Embodiment 1

An electronic component as shown in FIG. 2 with a circuit arrangement as shown in FIG. 9 with resistors R connected between the input 12 and the output 13 of the circuit arrangement, capacitor $C_B$ connected between the input 12 and the output 13 of the circuit arrangement, and pn diodes D connected between the input 12 and ground of the circuit arrangement, comprises a semiconducting substrate 1 of Si with P as the dopant of a first doping type with a first doping density n1. The semiconductor substrate 1 has first semiconductor regions 2 which comprise Si with B as the dopant of the first doping type with a second doping density n2. The doping density n1 is greater than the doping density n2. A second, smaller semiconductor region 3 comprising Si with P as the dopant of a second doping type with a third doping density n3 is present in each first semiconductor region 2. An insulating layer 4 of $SiO_2$ provided on the semiconducting substrate 1, and a barrier layer 5 of $TiO_2$ lies on the insulating layer 4. A structured first electrically conducting layer 6 of Ti/Pt is provided on the barrier layer 5. A first dielectric layer 7 comprising $PbZr_{0.53}Ti_{0.47}O_3$ with 2% lanthanum doping is present on the first electrically conducting layer 6. A structured resistance layer 14 of β-Ta lies on the first dielectric layer 7. A structured second electrically conducting layer 10 of Al doped with Cu is present on the resistance layer 14. The circuit arrangement further comprises a first current supply lead 8 of Al doped with Cu which connects the second semiconductor region 3 to the input 12 of the circuit arrangement, and a second current supply lead 9 of Al which connects the first electrically conducting layer 6 to the output 13 of the circuit arrangement. The resistance layer 14 is structured such that on the one hand it forms the resistor and on the other hand it forms the second electrode of the large capacitor in conjunction with the second electrically conducting layer 10. Furthermore, the resistance layer 14 is present also in the regions of the first and second current supply leads 8, 9. A protective layer 11 of SiN(H) and benzocyclobutene is present over the entire assembly. Openings defining the input 12 and the output 13 of the circuit arrangement are present in the protective layer 11.

Bump contacts of NiV/Cu/($Pb_{0.4}Sn_{0.6}$) are grown in the openings for electrical contacting of the input 12, the output 13, and the ground terminal.

Such an electronic component was incorporated as a low-pass filter in the peripheral circuitry of a mobile telephone device.

Embodiment 2

For the manufacture of an electronic component with a circuit arrangement as shown in FIG. 9, with resistors R connected between the input 12 and the output 13 of the circuit arrangement, large capacitors $C_B$ connected between the input 12 and the output 13 of the circuit arrangement, and pn diodes D connected between the input 12 and ground of the circuit arrangement, first a semiconductor substrate 1 of Si with B as the dopant of a first doping type with a first doping density n1 was coated with an epitaxial silicon layer which comprised B as the dopant of the first doping type with a fourth doping density n4. The fourth doping density n4 was smaller than the first doping density n1. A thin oxide layer of $SiO_2$ was provided on the epitaxial silicon layer and was structured such that the oxide layer remained in those locations where the second semiconductor regions 3 of the pn diodes were to be made. Boron atoms were implanted and diffused into the regions of the eptiaxial silicon layer not covered by the oxide layer, such that a semiconducting substrate 1 with B as the dopant of the first doping type with a first doping density n1 was created, which comprised first semiconductor regions 2 having B as the dopant of the first doping type with a doping density n2. Openings were created in the oxide layer formed by the diffusion process down to the first semiconductor regions 2 by means of lithographic structuring methods. Phosphorus atoms were implanted and diffused into the exposed first semiconductor regions 2, such that smaller, second semiconductor regions 3 were created in the first semiconductor regions 2, which regions 3 comprised phosphorus as the dopant of a second doping type with a doping density n3. In this diffusion process, an $SiO_2$ layer grew in the openings, which together with the oxide layer already present on the semiconductor substrate 1 formed the insulating layer 4. The barrier layer 5 of $TiO_2$ was sputtered onto the insulating layer 4. The first electrically conducting layer 6 of Ti/Pt was deposited on the barrier layer 5 and was structured by means of reactive ion etching such that it formed the first electrodes of the large capacitors. The first dielectric layer 7 of $PbZr_{0.53}Ti_{0.47}O_3$ with 2% lanthanum doping was provided on this assembly in a spinning process. Openings were etched into the first dielectric layer 7 down to those regions of the first electrically conducting layer 6 which formed the respective first electrodes of large capacitors by means of wet-chemical etching processes. In addition, openings were etched down to each second semiconductor region 3. For this purpose, respective openings were created which traversed the first dielectric layer 7, the barrier layer 4, and the insulating layer 4. The resistance layer 14 of $Ti_{0.9}W_{0.1}$ with a nitrogen doping was deposited on the first dielectric layer 7 and in the openings. A second electrically conducting layer 10 of al doped with Cu was deposited on the resistance layer 14 and in the remaining regions of the openings and was structured such that together with the resistance layer 14 it served in these regions as the second electrode of the large capacitors, as the first current supply leads 8 connecting the second semiconductor regions 3 of the pn diodes each to an input 12 of the circuit arrangement and to a resistor, as the second current supply leads 9 connecting those regions of the first electrically conducting layer 6 which form the first electrodes of the large capacitors to an output 13 of the circuit arrangement, and as a connection line interconnecting the individual components of the circuit arrangement. A protective layer 11 of SiN(H) was provided over the entire structure through deposition from the gas phase. Openings were etched into the protective layer 11 in a wet-chemical etching process, defining the input 12 and the output 13 of the circuit.

Bump contacts of $NiV/Cu/(Pb_{0.4}Sn_{0.6})$ were grown in the openings in the protective layer 11 for electrical contacting of the input 12 and the output 13.

Such an electronic component was incorporated as a low-pass filter in the peripheral circuitry of a mobile telephone device.

Embodiment 3

An electronic component with a circuit arrangement as shown in FIG. 9 was manufactured in a manner analogous to embodiment 2, except for the fact that the resistance layer 14 of β-Ta, after being deposited, was structured such that it remained only in those locations where a resistor was to be present in the circuit arrangement.

Embodiment 4

For manufacturing an electronic component as shown in FIG. 3 with a circuit arrangement as shown in FIG. 11, a semiconductor substrate 1 was provided with a first semiconductor region 2 and a second, smaller semiconductor region 3 in the same manner as in embodiment 2. The insulating layer 4, the barrier layer 5, the first electrically conducting layer 6, and the first dielectric layer 7 were provided on the semiconducting substrate 1 in the same manner as described for embodiment 2. The insulating layer comprised $SiO_2$, the barrier layer 5 comprised $Al_2O_3$, the electrically conducting layer 6 comprised Pt, and the dielectric layer comprised $Pb(Mg_{1/3}Nb_{2/3})O_3$-$PbTiO_3$. Openings were etched in a wet-chemical etching process through the first dielectric layer 7 down to those regions of the first electrically conducting layer 6 which formed the respective first electrodes of large capacitors. An opening was created to the semiconducting substrate 1 in the vicinity of each first electrode of a large capacitor. In addition, openings were etched down to each second semiconductor region 3. The openings were filled with $Ti_{0.9}W_{0.1}/Al$ doped with Cu, and a layer of $Ti_{0.9}W_{0.1}/Al$ doped with Cu was provided on the first dielectric layer 7. This formed layer was structured such that it formed on the one hand the second electrodes of the large capacitors, acting as the second electrically conducting layer 10, and on the other hand acted as the first current supply lead 8 and the second current supply lead 9 in the regions of the openings filled with $Ti_{0.9}W_{0.1}/Al$ doped with Cu. A resistance layer 14 of Ta was deposited on those regions of the first dielectric layer 7 on which no second electrically conducting layer 10, no first current supply lead 8, and no second current supply lead 9 were present and where a resistor was to be created. The resistance layer 14 was provided for the purpose of contacting of the resistors such that it partly overlapped the first current supply lead 8 and the second electrically conducting layer 10. A protective layer 11 of SiN(H) and polyimide was provided over the entire structure.

Openings were etched in the protective layer 11 in a wet-chemical etching process, defining the input 12, the output 13, and the ground terminal 15 of the circuit.

Bump contacts of NiCr/Cu/Ni/Au were grown in the openings in the protective layer 11 for electrical contacting of the input 12, the output 13, and the ground terminal 15. The input 12 of the circuit arrangement was in electrical contact with the first current supply lead 8, and the ground terminal 15 was in electrical contact with the second current supply lead 9. The first current supply lead 8 connected the input 12 to the second semiconductor region 3 of the pn diode and to the resistance layer 14. The second current supply lead 9 connected the first electrically conducting layer 6 to the ground terminal 15 and the semiconductor substrate 1.

Such an electronic component was incorporated as a low-pass filter in the peripheral circuitry of a mobile telephone device.

Embodiment 5

An electronic component as shown in FIG. 4 with a circuit arrangement as shown in FIG. 11 was manufactured as described for embodiment 4, except for the fact that first the resistance layer 14 was deposited on the first dielectric layer 7 and in the openings. Then the second electrically conducting layer 10 and the first and second current supply leads 8, 9 were manufactured through deposition of Al doped with Cu and subsequent structuring.

Embodiment 6

An electronic component as shown in FIG. 5 with a circuit arrangement as shown in FIG. 11 were manufactured in the same manner as in embodiment 5 up to the deposition of the protective layer 11. During the provision of the protective layer 11, however, only part of the material was initially provided over the entire structure. Then a third electrically conducting layer 16 of Al doped with Cu was provided and structured such that it formed the second electrodes of the small capacitors. The remaining material of the protective layer 11 was provided over the entire assembly. The outputs 13 were connected to the third electrically conducting layer 16.

Embodiment 7

For the manufacture of an electronic component as shown in FIG. 6 with a circuit arrangement as shown in FIG. 12, a semiconductor substrate 1 was provided with first semiconductor regions 2 and second semiconductor regions 3 in the same manner as in embodiment 2. Openings were etched into the insulating layer 4 of $SiO_2$ down to the semiconductor regions 3 and down to the semiconducting substrate 1 by means of a wet-chemical etching process. An insulating layer 4 was grown in these openings again in a thermal process, the layer thickness thereof being smaller than that of the rest of the insulating layer 4. A second dielectric layer 17 of SiN(H) was deposited over the entire assembly. A fourth electrically conducting layer 18 of Ta was deposited on the second dielectric layer 17 and was structured such that it remained in the region of those openings which originally extended down to the semiconducting substrate 1 and in those regions where a resistor was to be present. The anti-reaction layer 20 of SiN(H) was provided on the fourth electrically conducting layer 18. The barrier layer 5 of $TiO_2$ was provided over this entire structure. The first electrically conducting layer 6 of Ti/Pt was provided on the barrier layer 5 and was structured such that it formed the first electrodes of the large capacitors. The first dielectric layer 7 of $PbZr_{0.53}Ti_{0.47}O_3$ with 2% lanthanum doping was provided over this entire assembly. Openings were etched into the first dielectric layer 7 down to the first electrically conducting layer 6 by means of a wet-chemical etching process. Furthermore, an opening was etched down to each second semiconductor region 3. Openings were also etched down to the fourth electrically conducting layer 18 and to the semiconductor substrate 1. The openings were filled with $Ti_{0.9}W_{0.1}$/Al doped with Cu, and a layer of $Ti_{0.9}W_{0.1}$/Al doped with Cu was provided on the first dielectric layer 7. This layer of $Ti_{0.9}W_{0.1}$/Al doped with Cu was structured such that on the one hand, constituting the second electrically conducting layer 10, it formed the second electrodes of the large capacitors, and on the other hand it acted in the regions of the openings filled with $Ti_{0.9}W_{0.1}$/Al doped with Cu as the first current supply lead 8, as the second current supply lead 9, as the third current supply lead 19, and as the connecting line between the individual components of the circuit arrangement.

A protective layer 11 of SiN(H)/benzocyclobutene was provided over the entire assembly. Openings defining the input 12, the output 13, and the ground terminal 15 of the circuit were etched into the protective layer 11 in a wet-chemical etching process.

Bump contacts of NiCr/Cu/Ni/Au were grown in the openings of the protective layer 11 for electrical contacting of the input 12, the output 13, and the ground terminal 15. Each input 12 of the circuit was in electrical contact with a first current supply lead, each ground terminal 15 was in electrical contact with a third current supply lead 19, and each output 13 was electrically connected to a second current supply lead 9. The first current supply lead 8 connected the input 12 to the second semiconductor region 3 of the pn diode and to those regions of the fourth electrically conducting layer 18 where the latter acted as a resistor. The second current supply lead 9 connected the first electrically conducting layer 6 to the output 13. The electrically conducting layer 10, which also served as a connecting line, was in electrical contact with the fourth electrically conducting layer 18 in that region where it acted as a resistor and in that region where it acted as the second electrode of the small capacitors.

Such an electronic component was incorporated as a low-pass filter in the peripheral circuitry of a mobile telephone device.

Embodiment 8

For the manufacture of an electronic component as shown in FIG. 7, a semiconducting substrate 1 was provided with first semiconductor regions 2 and second semiconductor regions 3, as described for embodiment 7. Openings were etched into the insulating layer 4 of $SiO_2$ down to the second semiconductor regions 3 as well as openings down to the semiconducting substrate 1, in a wet-chemical etching process. An insulating layer 4 was grown again in these openings in a thermal process, the layer thickness thereof being smaller than that of the rest of the insulating layer 4. A second dielectric layer 17 of SiN(H) was deposited over the entire structure. A fourth electrically conducting layer 18 of polycrystalline silicon was deposited on the second dielectric layer 17 and was structured such that it remained only in the regions of those openings which originally extended down to the semiconducting substrate 1. The anti-reaction layer 20 of SiN(H) was provided on the fourth electrically conducting layer 18. The barrier layer 5 of $TiO_2$ was provided over this entire structure. The first electrically conducting layer 6 of Ti/Pt was provided on the barrier layer 5 and was structured such that it formed the first electrodes of the large capacitors. The first dielectric layer 7 of $PbZr_{0.53}Ti_{0.47}O_3$ with 2% lanthanum doping was provided over this entire assembly. Openings were etched in the first dielectric layer 7 down to the first electrically conducting layer 6 in a wet-chemical etching process. In addition, an opening was etched down to each of the second semiconductor regions 3 as well as to each fourth electrically conducting layer. Furthermore, openings were etched down to the semiconducting substrate. A resistance layer of $Ti_{0.9}W_{0.1}$ with nitrogen doping was deposited in said openings and on the first dielectric layer 7. The openings were filled with Al doped with Cu, and a layer of Al was provided on the resistance layer 14. This Al layer was structured such that, together with the resistance layer 14 in the respective regions, it acted as the second electrically conducting layer 10, thus forming the second electrodes of the large capacitors, and on the other hand it acted in the regions of the openings filled with $Ti_{0.9}W_{0.1}$ with nitrogen doping/Al doped with Cu as the first current supply lead 8, as the second current supply lead 9, as the third current supply lead 19, and as the first connection line 21.

A protective layer 11 of SiN(H)/benzocyclobutene was provided over the entire assembly. Openings defining the input 12, the output 13, and the ground terminal 15 of the circuit were etched into the protective layer 11 in a wet-chemical etching process.

Bump contacts of $NiV/Cu/(Pb_{0.4}Sn_{0.6})$ were grown in the openings in the protective layer 11 for electrical contacting of the input 12, the output 13, and the ground terminal 15. The input 12 of the circuit was in electrical contact with the first current supply lead 8, the ground terminal 15 was in electrical contact with the third current supply lead 19, and the output 13 was electrically connected to the second current supply lead 9. Each first supply lead 8 connected an input 12 to a region of the resistance layer 14 which acted as a resistor. Each first connection line 21 connected this region of the resistance layer 14 in addition to a second semiconductor region 3. Each second current supply lead 9 connected the first electrically conducting layer 6 to the output 13. The electrically conducting layer 10, which also acted as a connection line and electrically connected the large capacitor to the small capacitor, was in electrical contact with the fourth electrically conducting layer 18. Each third current supply lead 19 connected a ground terminal 15 to the semiconducting substrate 1.

Such an electronic component was incorporated as a low-pass filter in the peripheral circuitry of a mobile telephone device.

Embodiment 9

An electronic component as shown in FIG. 8 was manufactured in the same manner as described in embodiment 8, with the exception that no fourth electrically conducting layer 18 and no anti-reaction layer 20 were provided. Instead of the opening to the fourth electrically conducting layer 18, an opening was created to the dielectric layer 17. The diameter of the opening was chosen such that, after filling of the opening with β-Ta and Al doped with Cu, the second electrode of the small capacitor was created.

What is claimed is:

1. An electronic device provided with an electronic component comprising an integrated circuit arrangement including a semiconductor substrate having at least one active component and at least one capacitor provided over the semiconductor substrate and electrically connected to the active component, wherein a dielectric of the capacitor has as a dielectric constant $\epsilon_r > 20$, and the capacitor has a capacitance density in the range of 2 of 100,
   wherein the capacitor has a lower electrode and an upper electrode with the dielectric therebetween, a lead of the integrated circuit arrangement being contacted to an upper surface of the lower electrode; and
   wherein the lower electrode comprises a first conducting layer on top of and in direct contact with a barrier layer, and the upper electrode comprises a resistance layer in direct contact with a second electrically conducting layer.

2. An electronic device as recited in claim 1, wherein the dielectric is chosen from the group consisting essentially of $PbZr_xTi_{1-x}O_3$ ($0 \leq x \leq 1$) with and without dopants of La and/or Mn and/or Nb and with and without excess lead, layer packages of $PbZr_xTi_{1-x}O_3$ ($0 \leq x \leq 1$) and $PbZr_xTi_{1-x}O_3$ ($0 \leq x \leq 1$) with dopants of La and/or Mn and/or Nb and with and without excess lead, layer packages of $PbZr_xTi_{1-x}O_3$ ($0 \leq x \leq 1$) with and without dopants and with and without excess lead and $[PbMg_{1/3}Nb_{2/3}O_3]_x$-$[PbTiO_3]_{1-x}$ ($0 \leq x \leq 1$) with and without dopants, $Ba_{1-x}Sr_xTiO_3$ ($0 \leq x \leq 1$) with and without additions $VO_x$ ($1 \leq x \leq 2.5$) and/or $SiO_2$, $[Ba_{1-x}Sr_xTiO_3]$-$Pb_{1-y}Ca_yTiO_3$ ($0 \leq x \leq 1$, $0 \leq y \leq 1$), $Ba_{1-x}Sr_xZr_yTi_{1-y}O_3$
   ($0 \leq x \leq 1$, $0 \leq y \leq 1$) with and without dopants, $Ba_{1-x}Pb_xTiO_3$ ($0 \leq x \leq 1$) with and without excess lead, $Ba_{1-x}Ca_xTiO_3$ ($0 \leq x \leq 1$), $SrZr_xTi_{1-x}O_3$ ($0 \leq x \leq 1$) with and without dopants, $[PbMg_{1/3}Nb_{2/3}O_3]_x$-$[PbTiO_3]_{1-x}$ ($0 \leq x \leq 1$), with and without dopants and with and without excess lead $(Pb,BA,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$), $Pb_{1-x}Ca_xTiO_3$ ($\leq x \leq 1$), $(Ba_{1-x+y/8}Sr_{x+y/8})_xNa_{1-y}Nb_5O_{15}$ ($0 \leq x \leq 1$, $0 \leq y \leq 1$) with and without excess $Na^+$,
   $(Ba_{1-x+y/8}Sr_{x+y/8})_2K_{1-y}Nb_5O_{15}$ ($0 \leq x \leq 1$, $0 \leq y \leq 1$) with and without excess $K^+$,
   $(Ba_{1-x}Sr_x)_2K_{1-3}SE_yNb_5O_{15}$ ($0 \leq x \leq 1$, $0 \leq y \leq 1$, SE=ion from the group of rare earth metals), $Sr_2Ba_4Ti_2Nb_8O_{30}$, $(Ta_2O_5)_x$-$(Al_2O_3)_{1-x}$ ($0 \leq x \leq 1$), $(Ta_2O_5)_x$-$(TiO_2)_{1-x}$ ($0 \leq x \leq 1$), $(Ta_2O_5)_x$-$(Nb_2O_5)_{1-x}$
   ($0 \leq x \leq 1$), $(Ta_2O_5)_x$-$(SiO_2)_{1-x}$ ($0 \leq x \leq 1$), $(Ta_2O_5)_x$-$(ZrO_2)_{1-x}$ ($0 \leq x \leq 1$), $TiO_2$, $Nb_2O_5$ $Zr(Sn,Ti)O_4$, $BiNbO_4$ with and without $VO_x$ ($1 \leq x \leq 2.5$) and/or CuO dopants, $(Bi_{2-x}Zn_x)(Nb_{2-y}Zn_y)O_x$, $Bi_2(Zn_{1/3}Nb_{2/3})_2O_7$,
   a) $PbMg_{1/2}W_{1/2}O_3$
   b) $PbFe_{1/2}Nb_{1/2}O_3$
   c) $PbFe_{2/3}W_{1/3}O_3$
   d) $PbNi_{1/3}Nb_{2/3}O_3$
   e) $PbZn_{1/3}Nb_{2/3}O_3$
   f) $PbSc_{1/2}Ta_{1/2}O_3$
   as well as combinations of the compounds a)–f) with $PbTiO_3$ and/or $PbMg_{1/3}Nb_{2/3}O_3$, $CaO_xZnO_y(Nb_2O_5)_z$ (x=0.01 to 0.05, y=0.43 to 0.55, z=0.44 to 0.52), $(BaTiO_3)_{0.18\ to\ 0.27}$+
   $(Nd_2O_3)_{0.316\ to\ 0.355}$+$(TiO_2)_{0.276\ to\ 0.355}$+$(Bi_2O_3)_{0.025\ to\ 0.081}$+xZnO, $CaTiO_3$+$CaTiSiO_5$, (Sr,Ca)(Ti,Zr)O_3, (Sr,Ca,M)(Ti,Zr)O_3
   (M=Mg or Zn), $(Sr,Ca,Mg,Zn)(Ti,Zr,Si)O_3$,
   $(Sr,Ca,Cu,Mn,Pb)TiO_3$+$Bi_2O_3$, $BaO$-$TiO_2$-$Nd_2O_3$-$Nb_2O_5$, $(Bi_2O_3)_x(Nb_2O_5)_{1-x}$ with added $SiO_2$, $MnO_2$ or PbO,
   $(Ba,Ca)TiO_3$+$Nb_2O_5$, $Co_2O_3$, $MnO_2$, $BaO$-$PbO$-$Nd_2O_3$-$TiO_2$, $Ba(Zn,Ta)O_3$, $BaZrO_3$, $Ba_2Ti_9O_{20}$, $Ba_2Ti_{9-x}Zr_xO_{20}$ ($0 \leq x \leq 1$) with and without Mn-dopants, $BaTi_5O_{11}$, $BaTi_4O_9$, $Ca_xSm_yTi_zO_n$ ($0 \leq x \leq 1$, $0.5 \leq y \leq 1$, $0 \leq z \leq 1$, $0 \leq n \leq 1$),
   $[Bi_3(Ni_2Nb)O_9]_{1-x}$-$(Bi_2(ZnNb_{2(1+d)y}O_{3+6y+5yd})_x$ ($0 \leq x \leq 1$, $0.5 \leq y \leq 1,5$, $-0.05 \leq d \leq 0.05$), $CaZrO_3$, $Nd_{2Ti2}O_7$ and $PbNb_{4/5x}((Zr_{0.6}Sn_{0.4})_{1-y}Ti_y))_{1-x}O_3$ ($0 \leq x \leq 0.9$, $0 \leq y \leq 1$).

3. An electronic device as recited in claim 1, wherein the dielectric has a layer thickness d, which is less than 1.0 μm.

4. An electronic device provided with an electronic component as claimed in claim 1, characterized in that the capacitor is connected between an input and an output of the integrated circuit arrangement, between the input and ground, or between the output and ground of the integrated circuit arrangement.

5. An electronic device provided with an electronic component as claimed in claim 1, characterized in that the integrated circuit arrangement comprises at least one further passive component chosen from the group comprising resistors and capacitors.

6. A receiver provided with an electronic component which comprises an integrated circuit arrangement which has a semiconductor substrate with at least one active component and at least one capacitor provided over the semiconductor substrate and electrically connected to the active component, wherein a dielectric of the capacitor has a dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

7. A transmitter provided with an electronic component which comprises an integrated circuit arrangement which has a semiconductor substrate with at least one active component and at least one capacitor provided over the semiconductor substrate and electrically connected to the active component, wherein a dielectric of the capacitor has a dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

8. A peripheral circuit provided with an electronic component which comprises an integrated circuit arrangement which has a semiconductor substrate with at least one active component and at least one capacitor provided over the semiconductor substrate and electrically connected to the active component, wherein a dielectric of the capacitor has a dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

9. A power supply circuit which comprises an integrated circuit arrangement which has a semiconductor substrate with at least one active component and at least one capacitor provided over the semiconductor substrate and electrically connected to the active component, wherein a dielectric of the capacitor has a dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

10. A filter module which comprised an integrated circuit arrangement which has a semiconductor substrate with at least one active component and at least one capacitor provided over the semiconductor substrate and electrically connected to the active component, wherein a dielectric of the capacitor has a dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

11. An electronic component which comprises an integrated circuit arrangement which has a semiconductor substrate with at least one active component and at least one capacitor provided over the semiconductor substrate and electrically connected to the active component, wherein a dielectric of the capacitor has a dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

12. An integrated circuit arrangement which has a semiconductor substrate with at least one active component and at least one capacitor provided over the semiconductor substrate and electrically connected to the active component, wherein a dielectric of the capacitor dielectric constant $\epsilon_r > 20$, and the capacitor has a capacitance density in the range of 2 to 100, wherein the capacitor has a lower electrode and an upper electrode with the dielectric therebetween, a lead of the integrated circuit arrangement being contacted to an upper surface of the lower electrode; and wherein the lower electrode comprises a first conducting layer on top of and in direct contact with a barrier layer, and the upper electrode comprises a resistance layer in direct contact with a second electrically conducting layer.

13. An electronic device as recited in claim 1, wherein the active component is chosen from the group consisting essentially of: diodes and transistors.

14. An electronic device as recited in claim 13, wherein the diodes are chosen from the group consisting essentially of: a pn diode, a Zener diode, a back-to-back (reverse series) diode, a front-to-back (series) diode, and a floating diode.

15. An electronic device as recited in claim 1, wherein the active component is an overvoltage protection diode.

16. An electronic device as recited in claim 13, wherein said transistors are chosen from the group consisting essentially of: a bipolar transistor or a field effect transistor (FET) such as, for example, a junction field effect transistor (JFET), P-channel Metal Oxide Semiconductor Field Effect Transistor (PMOS-FET), N-channel Metal Oxide Semiconductor Field Effect Transistor (NMOS-FET), and Complementary Metal Oxide Semiconductor Field Effect Transistor (CMOS-FET).

17. An electronic device as recited in claim 1, wherein the semiconductor substrate is a material chosen from the group consisting essentially of silicon, a III-IV semiconductor compound, SiC, or SiGe.

* * * * *